(12) United States Patent
Fuller et al.

(10) Patent No.: US 12,707,928 B2
(45) Date of Patent: Aug. 11, 2026

(54) SUBSTRATE CONTAINER WITH MECHANICALLY ACTUATED EXHAUST VALVE

(71) Applicant: ENTEGRIS, INC., Billerica, MA (US)

(72) Inventors: Matthew A. Fuller, Colorado Springs, CO (US); Mark V. Smith, Colorado Springs, CO (US); Colton J. Harr, Monument, CO (US)

(73) Assignee: ENTEGRIS, INC., Billerica, MA (US)

( * ) Notice: Subject to any disclaimer, the term of this patent is extended or adjusted under 35 U.S.C. 154(b) by 423 days.

(21) Appl. No.: 18/105,119

(22) Filed: Feb. 2, 2023

(65) Prior Publication Data

US 2023/0245908 A1 Aug. 3, 2023

Related U.S. Application Data

(60) Provisional application No. 63/306,307, filed on Feb. 3, 2022.

(51) Int. Cl.
*H01L 21/673* (2006.01)
*G05D 7/06* (2006.01)
*H10P 72/10* (2026.01)

(52) U.S. Cl.
CPC ..... *H01L 21/67389* (2013.01); *G05D 7/0635* (2013.01)

(58) Field of Classification Search
CPC .................... H01L 21/67389; H01L 21/67393
See application file for complete search history.

(56) References Cited

U.S. PATENT DOCUMENTS

| | | | | |
|---|---|---|---|---|
| 7,201,276 | B2 | 4/2007 | Burns et al. | |
| 7,328,727 | B2 | 2/2008 | Tieben et al. | |
| 7,758,338 | B2 | 7/2010 | Hsiao | |
| 8,387,799 | B2 | 3/2013 | Chiu et al. | |
| 10,784,138 | B2 | 9/2020 | Abe | |
| 2002/0124428 | A1 | 9/2002 | Ouye | |
| 2004/0187451 | A1 | 9/2004 | Suzuki | |
| 2014/0158172 | A1* | 6/2014 | Hsu | B08B 9/46 134/18 |
| 2015/0101959 | A1 | 4/2015 | Chou et al. | |

(Continued)

FOREIGN PATENT DOCUMENTS

| | | | |
|---|---|---|---|
| CN | 106856664 | B | 6/2017 |
| EP | 3343596 | B1 | 7/2018 |

(Continued)

*Primary Examiner* — Allen R. B. Schult

(57) ABSTRACT

A system is provided. The system includes a substrate container having at least two purge modules. Each purge module of the at least two purge modules includes a flow control device. The flow control device of each purge module is configured to be actuated for egress of a purge fluid. A method of actuating flow control devices of purge modules of a substrate container is provided. The method includes starting a purge process of the substrate container; streaming a purge fluid into an interior of the substrate container, the substrate container having at least two purge modules, each purge module of the at least two purge modules including a flow control device, the flow control device of each purge module being configured to be actuated for egress of the purge fluid; and actuating the flow control device for egress of the purge fluid.

19 Claims, 18 Drawing Sheets

(56) References Cited

U.S. PATENT DOCUMENTS

| | | | |
|---|---|---|---|
| 2015/0170939 | A1 | 6/2015 | Rebstock |
| 2015/0294889 | A1 | 10/2015 | Smith et al. |
| 2019/0267266 | A1 | 8/2019 | Holeyannavar |
| 2020/0033308 | A1 | 1/2020 | Kotsugai et al. |
| 2020/0051844 | A1 | 2/2020 | Bellet |
| 2020/0365435 | A1 | 11/2020 | Fuller et al. |
| 2021/0166962 | A1 | 6/2021 | Woo |

FOREIGN PATENT DOCUMENTS

| | | | |
|---|---|---|---|
| JP | 2013179287 | A | 9/2013 |
| JP | 2015065259 | A | 4/2015 |
| JP | 6562078 | B2 | 8/2019 |
| KR | 20190054929 | A | 5/2019 |

* cited by examiner 210
210A
218
216
212
214
210B
Z
X 220
220A
214
218
216
212
220B
Z
X 500
510
540
520
530
FOUP Pressure (kPa)
Time (S)

550
510
580
570
590
FOUP Pressure (kPa)
Time (S)

SUBSTRATE CONTAINER WITH MECHANICALLY ACTUATED EXHAUST VALVE

FIELD

This disclosure is directed to a purge process control of a substrate container such as a front opening unified pod (FOUP), including actuating flow control device(s) of purge module(s) of the substrate container.

BACKGROUND

Substrates in the form of wafers may be processed to form semiconductor devices. Substrates may include glass, silicon, or any other material(s) suitable for semiconductor devices. A substrate may have a panel shape, and the panel may be circular, rectangle, or any other shape suitable for processing and carrying in a container. The wafer substrates, hereafter "substrates," undergo a series of process steps that include material layer deposition, doping, etching, or chemically or physically reacting material(s) of a particular substrate. A substrate container is used for storing the substrate and transporting the in-process substrates within a fabrication facility. Substrate containers include, for example, FOUPs, which typically include a shell having an interior space for holding substrates, and a plate for interfacing with various conveyors and other devices so that, for example, the FOUP may be moved around the processing facility. The shell and the plate are fixed to one another, for example by welding, connectors, etc.

During processing, gasses must be introduced and removed from the FOUP, for example during purge processes, thus requiring that the FOUP have one or more locations at which gas may enter or leave the FOUP. e.g. Substrates may be transferred from the FOUP to processing equipment through an equipment front end module (EFEM) that generally includes a load port for receiving the FOUP, a transfer unit, a frame or "mini-environment", and a fan filter unit used to generate gas flow within the EFEM.

When the FOUP is docked on a load port, a door of the load port interfaces with a door of the FOUP and disengage the door of the FOUP from a shell of the FOUP. When the door of the FOUP is disengaged (opened) from the shell, the EFEM permits the transfer unit housed within the EFEM to access the substrates stored within the FOUP. A flow of gas introduced by a fan filter unit flows through the EFEM from a top of the EFEM to a bottom of the EFEM.

SUMMARY

This disclosure is directed to a purge process control of a substrate container, including actuating one or more flow control devices of purge module(s) of the substrate container that is used, for example, in semiconductor manufacturing. More specifically, this disclosure is directed to configuring and actuating one or more flow control devices of purge module(s) based on timing and/or based on sensed environmental conditions on or within the substrate container, such as relative humidity, oxygen level, internal pressure, volatile organic compounds, etc. in real-time while purging.

In at least one example embodiment, a system includes a substrate container having at least two purge modules. Each purge module of the at least two purge modules includes a flow control device. The flow control device of each purge module is configured to be actuated for egress of a purge fluid.

In at least one example embodiment, a method of actuating flow control devices of purge modules of a substrate container includes starting a purge process of the substrate container; streaming a purge fluid into an interior of the substrate container, the substrate container having at least two purge modules, each purge module of the at least two purge modules including a flow control device, the flow control device of each purge module being configured to be actuated for egress of the purge fluid; and actuating the flow control device for egress of the purge fluid.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
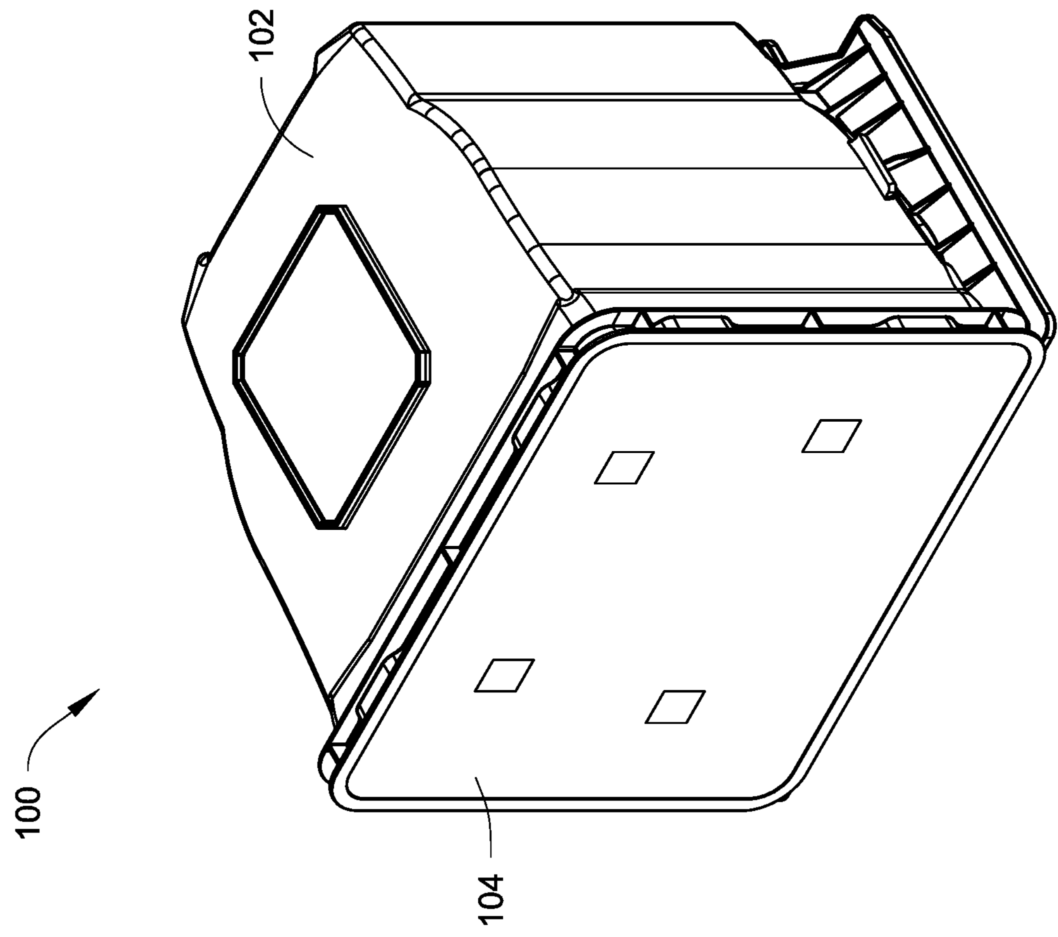
FIG. 1 is a front prospective view of a substrate container, according to at least one example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not intended to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

This disclosure is directed to a purge process control of a substrate container, including actuating one or more flow control devices of purge module(s) of the substrate container that is used, for example, in semiconductor manufacturing. More specifically, this disclosure is directed to configuring and actuating one or more flow control devices of purge module(s) based on timing and/or based on sensed environmental conditions on or within the substrate container, such as relative humidity, oxygen level, internal pressure, volatile organic compounds, etc. in real-time while purging.

As defined herein, the term "actuation" of a flow control device, or "actuate" or "actuating" the flow control device may refer to opening or a control of opening the flow control device to allow the purge fluid to pass through the flow control device (e.g., for egress of the purge fluid from the interior space of a substrate container) using active mechanism (e.g., with an actuator or the like) other than passive mechanism (such as passively opening the flow control device by or via the pressure of the purge fluid). The term "un-actuation" of a flow control device, or "un-actuate" or "un-actuating" the flow control device may refer to stopping or a control of stopping the use of the active mechanism, for the actuated flow control device, such that the flow control device is not actuated anymore. That is, the term "actuated" or "un-actuated" may refer to a state of the flow control device, and the terms "actuate", "actuating". "un-actuate", and "un-actuating" may refer to action(s) of changing the state of the flow control device.

As defined herein, the term "ingress" may refer to a purge fluid flowing, e.g., through a flow control device, in a direction from a load port to an interior space of a substrate container. As defined herein, the term "egress" may refer to a purge fluid flowing, e.g., through a flow control device, in a direction from the interior space of the substrate container to the load port.

As defined herein, the term "purge fluid" may refer to one or more of nitrogen, clean dry air (CDA), extra clean dry air (xCDA), gas for conditioning a container environment, or any other suitable fluid.

As defined herein, the term "cracking pressure" of a flow control device (e.g., a check valve or the like) may refer to a minimum upstream pressure required to open the flow control device enough to allow detectable flow. Detectable flow is when the flow control device allows a small but steady flow of fluid (e.g., liquid, gas, or the like) to pass through the body (e.g., valve body or the like) of the flow control device and out through the outlet port of the flow control device. In an embodiment, cracking pressure of a flow control device may also refer to an inlet pressure level at which the first sign of fluid flow is present. As defined herein, the term "cracking pressure" of a door (e.g., of a substrate container) or of a door seal may refer to a pressure at which the seal of the door is failing (e.g., the door seal starts to leak, or a leak from the door seal is generated).

As defined herein, the term "environmental condition" may refer to one of more of relative humidity (% RH) data, oxygen levels, temperature, pressure (e.g., absolute pressure or the like), a measured presence of airborne molecular contaminant, and/or a measured presence of one or more volatile organic compounds (VOCs). The environmental conditions may be detected or measured by sensor(s) on or inside the substrate container and the detected data may be communicated to controller(s) inside or outside of the container.

It will be appreciated that substrates in the form of wafers may be processed to form semiconductor devices. A substrate container, such as a FOUP for example, may be used to transport and store substrates during processing. In at least one other exemplary embodiment, the container may be a reticle container that contains photolithography masks.

In at least one example embodiment, when purging a substrate container (e.g., open door purge, closed door purge, etc.), the detected environmental conditions may be communicated to a controller in real-time, or may be stored using e.g., data loggers. The sensors and/or the data loggers may be placed on the substrate container or on the substrates inside the substrate container and positioned to capture the environmental conditions in various locations (e.g., front, back, right, and left of an interior of the substrate container at various slots that accommodate the wafers).

FIG. 1 is a front prospective view of a substrate container 100, according to at least one embodiment.

As shown in FIG. 1, the substrate container 100 includes a door 104 and a shell 102. The door 104 couples to the shell 102 and forms an enclosed interior space. The door 104 may be coupled to shell 102 by being mechanically latched or suction-fitted within a corresponding opening of shell 102; or, alternatively, the door 104 may be coupled to shell 102 (e.g., via a hinge) on one of the top, bottom, or either side of the corresponding opening of shell 102. In at least one example embodiment, the door of the substrate container may be coupled to shell of the substrate container on a bottom opening of the shell.

Figure 2:
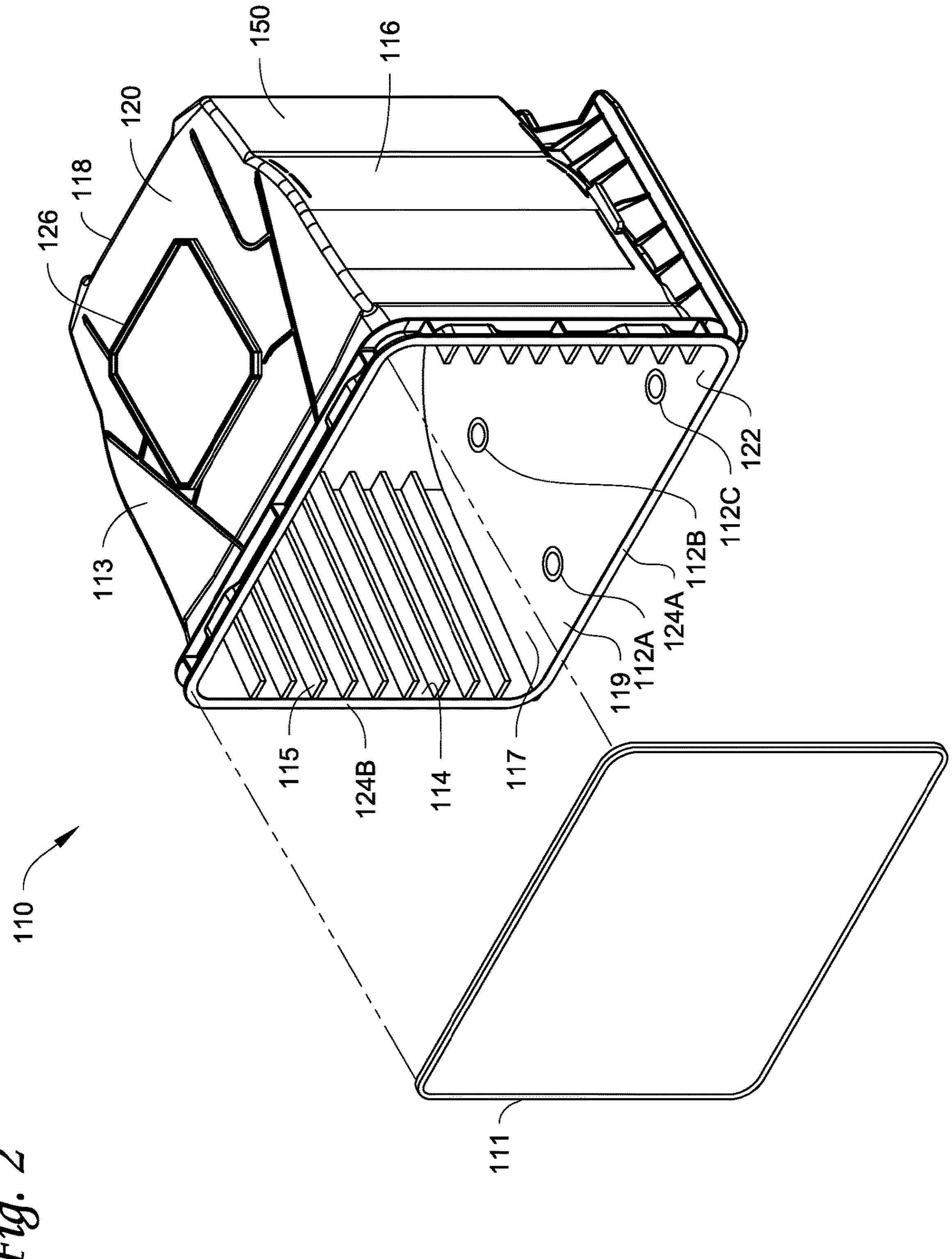
FIG. 2 is an exploded view of a substrate container, according to at least one example embodiment.

FIG. 2 is an exploded view of a substrate container 110, according to at least one example embodiment FIG. 2 illustrates substrate container 110 with the door 111 removed (e.g., opened). As shown in FIG. 2, the shell 113 defines an interior space 117 of the substrate container 110 in which substrates may be stored.

The shell 113 may include an opening 119, which may be enclosed by door 111 coupled to the shell 113. The substrate container 110 may be accessed by moving (e.g., opening, removing) the door 111. For example, the door 111 may be coupled to the shell 113 by fitting the door 111 into the opening 119 of shell 113. In at least one example embodiment, one or more of the door 111 and the shell 113 may include a locking mechanism (not shown) to prevent inadvertent opening or removal of the door 111. In at least another example embodiment, the opening of the shell 113 may be at the bottom of the shell.

As shown in FIG. 2, the shell 113 may further include a first side wall 114, a second side wall 116, a rear wall 118, and a top wall 120, and a bottom wall 122.

In at least one example embodiment, the first side wall 114 may be opposed and parallel to the second side wall 116, separated by the top wall 120 and the bottom wall 122. The first side wall 114 may be referred to as the left side while the right side 116 may be referred to as the right side, though the designation of "left" or "right" is a matter of viewing perspective, and is not intended to be limiting in any manner.

The top wall 120 and bottom wall 122 each extend between the first side wall 114 and the second side wall 116. In at least one example embodiment, the top wall 120 may be opposed and parallel to the bottom wall 122 separated by the first side wall 114 and the second side wall 116. The bottom wall 122 includes an edge 124A that extends along the front opening 119. The edge 124A also extends between the first side wall 114 and the second side wall 116 of the shell 113. The first side wall 114 includes an edge 124B that extends along the front opening 119. The edge 124B of the first side wall 114 also extends between the top wall 120 and the bottom wall 122 of the shell 113. The front edges 124A and 124B, in at least one example embodiment, are perpendicular to each other and define the front opening 119.

The substrate container 110 may include an equipment connector (also referred to as an "automation flange") 126 on the top wall 120 of the shell 113. In at least one example embodiment, the equipment connector 126 allows an automated attachment (not shown) for moving the substrate container 110. The automated attachment may include, but not be limited to, an automated arm (also referred to as an "overhead transfer system"), that may be connected to the substrate container 110. For example, the automated arm may be used to move the substrate container 110 between different pieces of processing equipment. In at least one example embodiment, the substrate container 110 may include one or more handles (not shown) to allow a user (e.g., a technician, etc.) to manually move the substrate container 110.

The substrate container 110 may further include a plurality of shelves 115 for holding substrates in the interior space 117.

In at least one example embodiment, the interior space 117 includes internal walls/surfaces of walls 114, 116, 118, 120, and/or 122. The portions of the shelves 115 on the interior surface of second side wall 116 are obscured in FIG. 2, which may have a similar configuration to the portions on the shelves 115 on the first side wall 114. The shelves 115 on the interior surface of walls 114 and 116 may be configured to cooperatively hold a substrate (not shown) within the interior space 117. For example, the shelves 115 may form and/or define slots and are sized to hold a specific size of substrate (e.g., 150 mm wafers, 200 mm wafers, etc.).

In accordance with at least one example embodiment, when the door 111 of the substrate container 110 is open, purge fluid may be supplied to the interior space 117 to reduce ingress of the external environment (e.g., gas, particles, humidity, etc.) through the front opening 119 into the substrate container 110. For example, the supplied purge fluid may flow out from interior space 117 through the front opening 119, thus reducing any gas or substance from flowing inward into the interior space 117 through the front opening 119. In at least one example embodiment, a door of a load port is configured to interface with the door 111 and disengage the door 111 from the shell 113 (to open the door 111). In at least one example embodiment, a controller is configured to open/close the door 111. A purge process may be controlled before door opening, during door opening, while door is closing, and when door is closed. The purge fluid may be a generally inert gas such as nitrogen. The purge fluid may also be clean dry air (CDA) or extra clean dry air (xCDA). The purge fluid may further be any gas used to condition the substrates or any other suitable gas. It will be appreciated that a purge tower (not shown) may facilitate the flow of purge fluid into the substrate container 110 such that the purge fluid may be directed toward and then away from the wafers housed in the substrate container 110. The purge fluid may sweep the container and its contents, picking up residual moisture, oxygen and atmospheric micro-contaminants (AMCs) and encouraging movement of particulates toward outlet purge port(s) or door opening.

The bottom wall 122 of the substrate container 110 includes purge port(s) (112A, 112B, 112C) for accommodating or housing purge module(s) and for supplying the purge fluid into the interior space 117. For example, the substrate container 110 may be supplied with a first stream of purge fluid through a first purge port 112A, a second stream of purge fluid through a second purge port 112B, and/or a third stream of purge fluid through a third purge port 112C. In at least one example embodiment, one or more of the purge ports (112A, 112B, 112C) may be configured as either an inlet purge port or an outlet purge port. The substrate container 110 may include a fourth inlet/outlet purge port (not shown). The embodiments described and recited herein are not limited to four or fewer purge ports. That is, the quantity described and recited herein are provided for descriptive purposes only and are not intended to be limiting. In at least one example embodiment, the inlet/outlet purge port(s) may be disposed on side walls of the substrate container 110.

The shell 113 has an external surface 150. Each of the inlet/outlet purge port(s) (112A, 112B, 112C, etc.) extends from the interior space 117 through the bottom wall 122 to the external surface 150 of the shell 113. The substrate container 110 may include four inlet/outlet purge port(s) or a different number of inlet/outlet purge port(s). In at least one example embodiment, the substrate container 110 may include one or more purge ports. In at least one example embodiment, the substrate container 110 may include one or more front purge ports (corresponding to and in fluid connection with 210 and/or 240 of FIG. 5, respectively) and one or more rear purge ports (corresponding to and in fluid connection with 220 and/or 230 of FIG. 5, respectively). In at least one example embodiment, one or more of the front purge ports may be outlet purge port(s) for discharging gas in the interior space 117 out of the substrate container 110.

The purge port(s) (112A, 112B, 112C) may allow a fluid such as a purge fluid (for example, nitrogen) to flow into the substrate container 110. A check valve (not shown, for example, a mechanical check valve) may be provided to facilitate the flow of a fluid, including gases being purged from the substrate container 110, from the interior space 117 of the substrate container 110 out through outlet purge port(s) (112A, 112B, 112C, or the fourth purge port).

Figure 3:
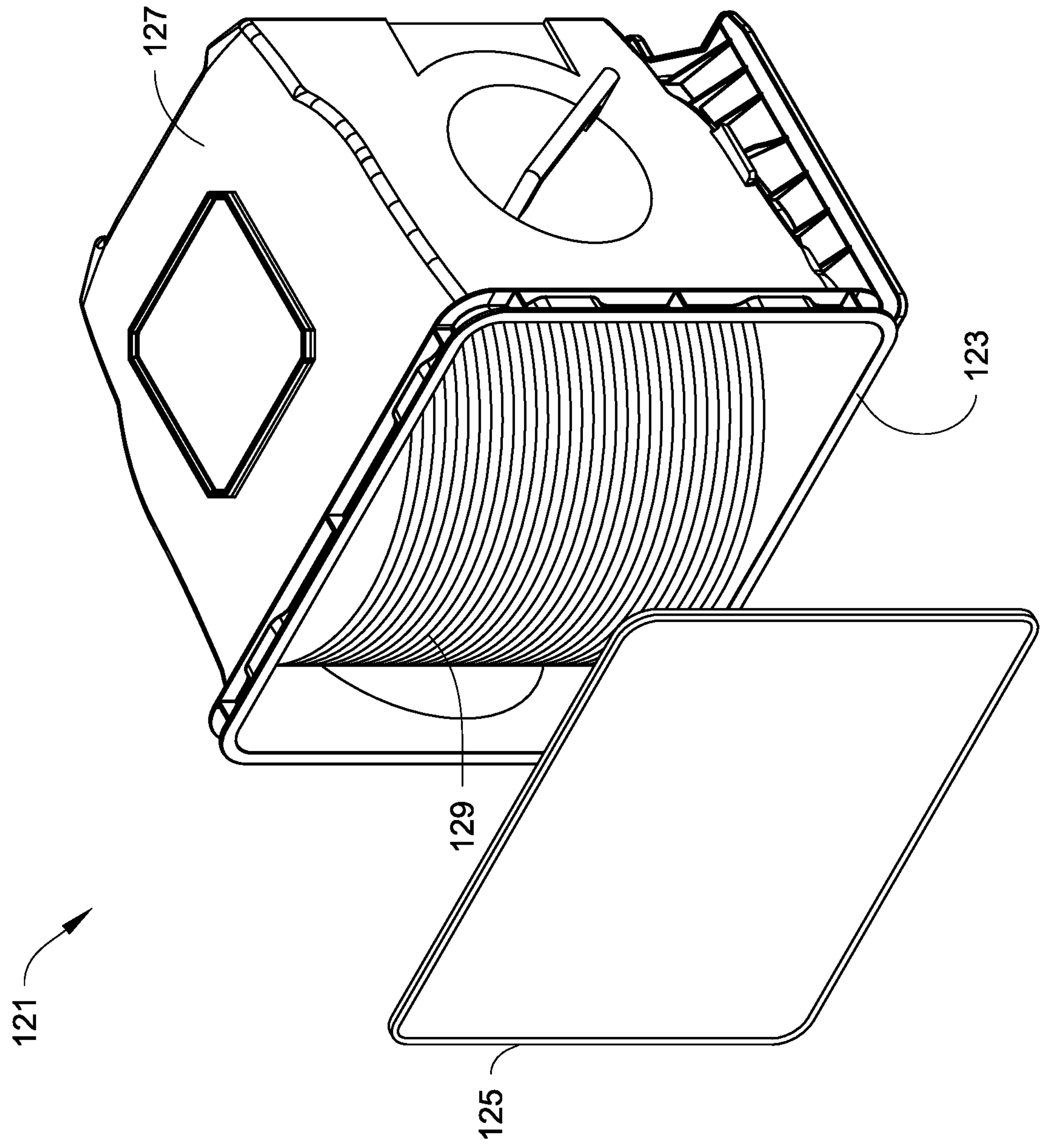
FIG. 3 is an exploded view of a substrate container, according to at least one other example embodiment.

FIG. 3 is an exploded view of a substrate container 121, according to at least one example embodiment. The substrate container 121 includes an open front 123, a door 125, and a shell 127. Wafers 129 may be inserted and removed horizontally through the open front 123. Slots (not visible) formed in the interior sides of the shell 127 accommodate the wafers 129. The door 125 may include a seal to engage with the shell 127 to form an internal environment that is isolated from the ambient atmosphere.

Figure 4:
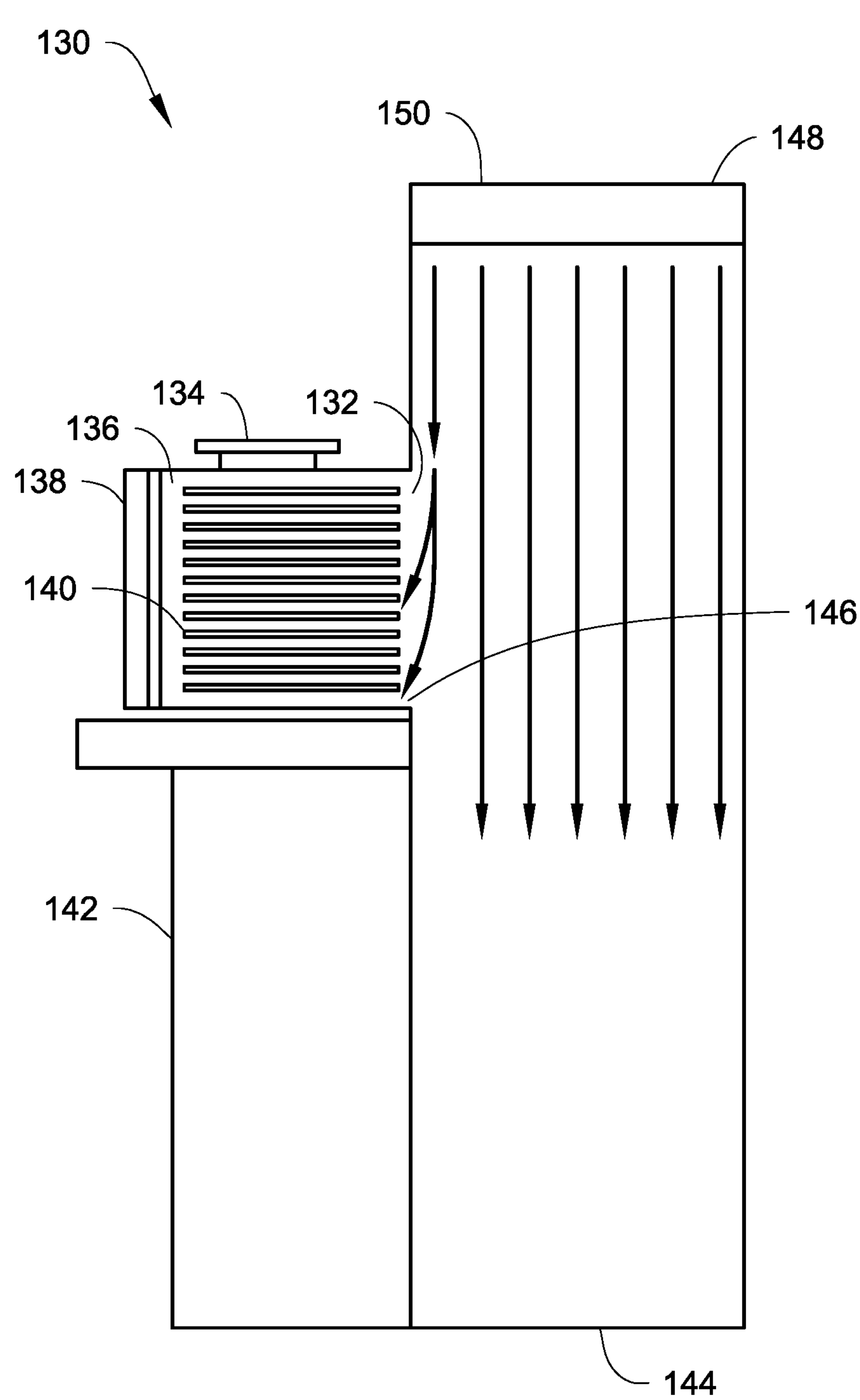
FIG. 4 is a schematic view of a substrate container interacting with an EFEM, according to at least one example embodiment.

FIG. 4 is a schematic view 130 of a substrate container 138 interacting with an EFEM 148, according to an embodiment. The substrate container 138 is docked on a load port 142 adjacent the EFEM 148. The substrate container 138 may be any front opening substrate carrier such as, for example, a FOUP, a front opening shipping box (FOSB), or a multi-application carrier (MAC). It will be generally understood by those of skill in the art that many of the concepts disclosed herein may have applicability to other substrate containers or carriers and more particularly other front opening or bottom opening substrate containers or carriers. The substrate container 138 may include an equipment hookup 134. When the substrate container 110 is attached to the EFEM 148, the front opening 132 of the substrate container 110 is positioned along an interior of EFEM 148.

In use, the substrate container 138 may dock on the load port 142, and a door of the load port 142 interfaces with a door (e.g., 125 of FIG. 3) of the substrate container 138 and disengages the door of the substrate container 138 from a shell of the substrate container 138. When the door of the substrate container 138 is disengaged (opened) from the shell, the EFEM 148 permits a robotic arm housed within the EFEM 148 to access the semiconductor wafers 140 stored within the substrate container 138. Gas (e.g. nitrogen, extra clean dry air, etc.) may flow through the EFEM 148 from a top 150 of the EFEM 148 to a bottom 144 of the EFEM 148, as indicated by the arrows in FIG. 4, to reduce contaminants within the EFEM 148.

When the front opening 132 of the substrate container 138 interfaces with the load port opening 146 of the EFEM 148 creating a FOUP-EFEM interface, some of the gas flowing through the EFEM 148 and across the load port opening 146 may flow into the interior 136 of the container 138, potentially interfering with the purging capabilities of the substrate container 138 by temporarily causing an increase in the internal environment such as the relative humidity and/or oxygen levels within the microenvironment of substrate container 138, which may be undesirable. In addition, not all EFEMs have the same construction. The size and dimensions of the EFEMs as well as the internal structure of the EFEMs may vary depending upon the manufacturer. The variability in size and construction between EFEMs of different manufactures may create differences in the purge performance of the substrate container 138 when the substrate container 138 is utilized with different EFEMs. It will be appreciated that during purging process of the substrate container 138, purge fluid may be distributed throughout the interior of the container 138 including the front opening 132 to counter the turbulent flows of the gas from the EFEM 148 into the interior space 136 through the front opening 132. A controller (described in detail in FIGS. 6 and 7) may be configured to adjust the purge flow parameters (e.g., gas flow rate) for the substrate container 138 to achieve optimized environmental response (e.g., % RH, pressure, etc.) with impact from different EFEMs.

Figures 5A, 5B:
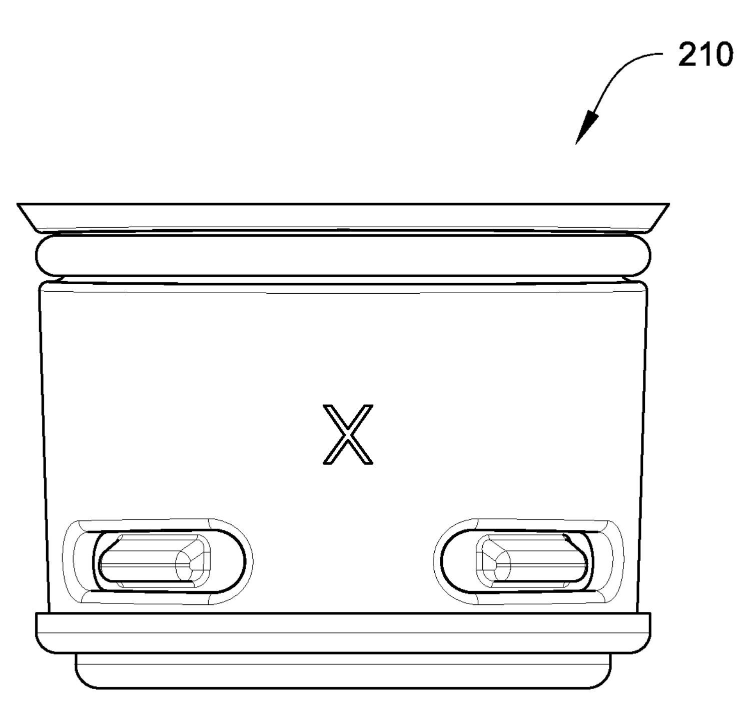
FIGS. 5A-5F illustrate a purge module of a substrate container, according to at least one embodiment.
Figure 5C:
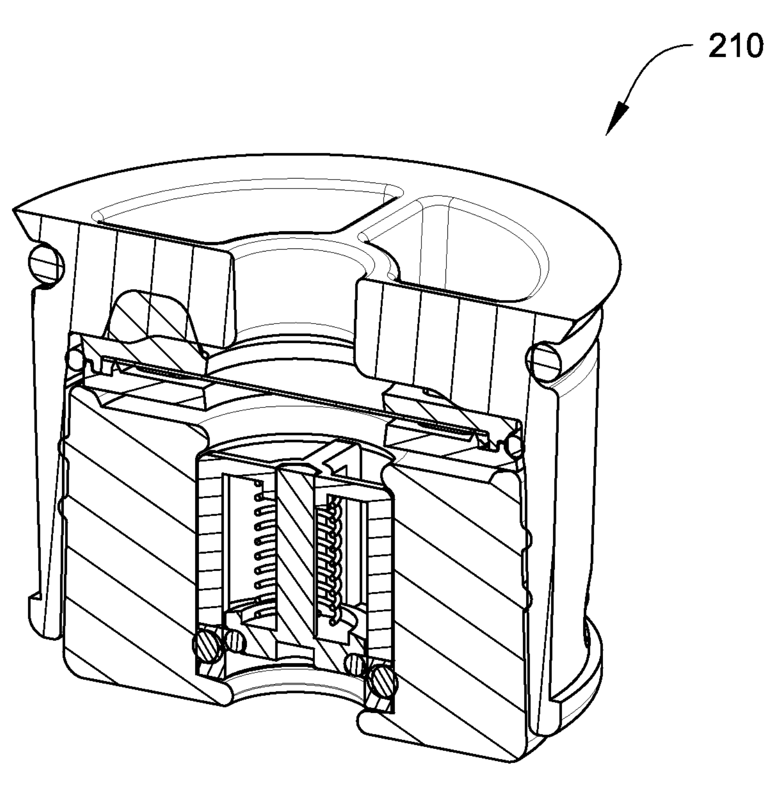
Figure 5D:
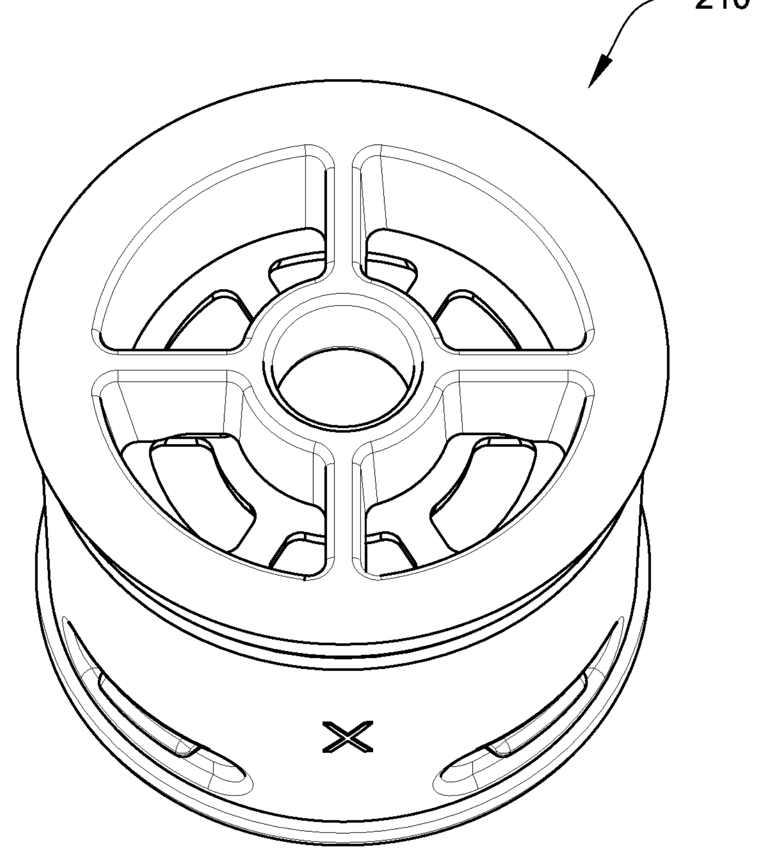
Figure 5E:
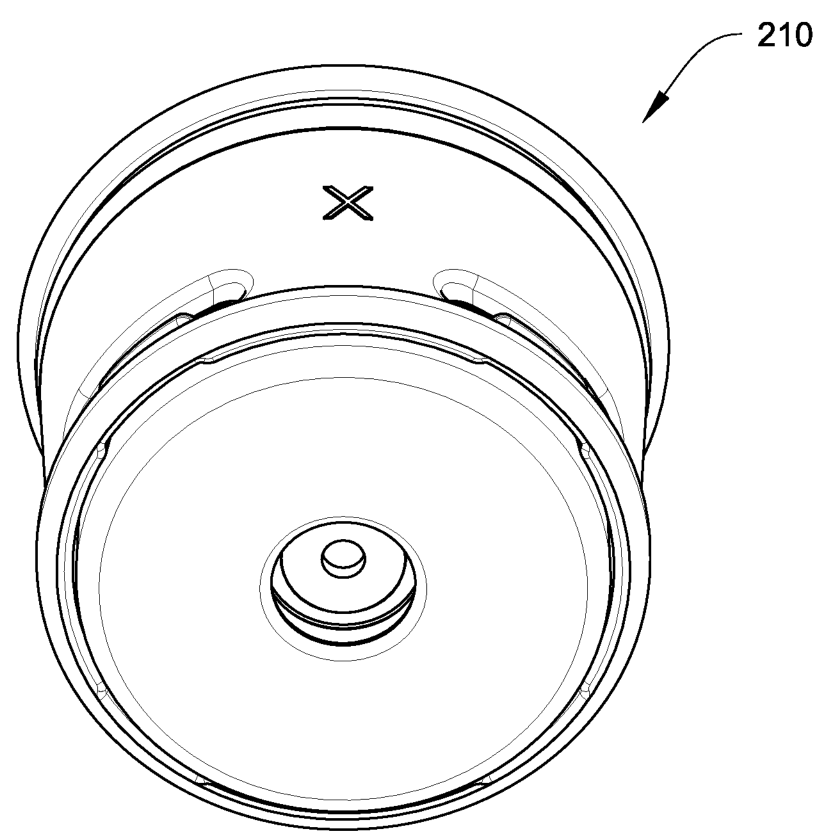
Figure 5F:
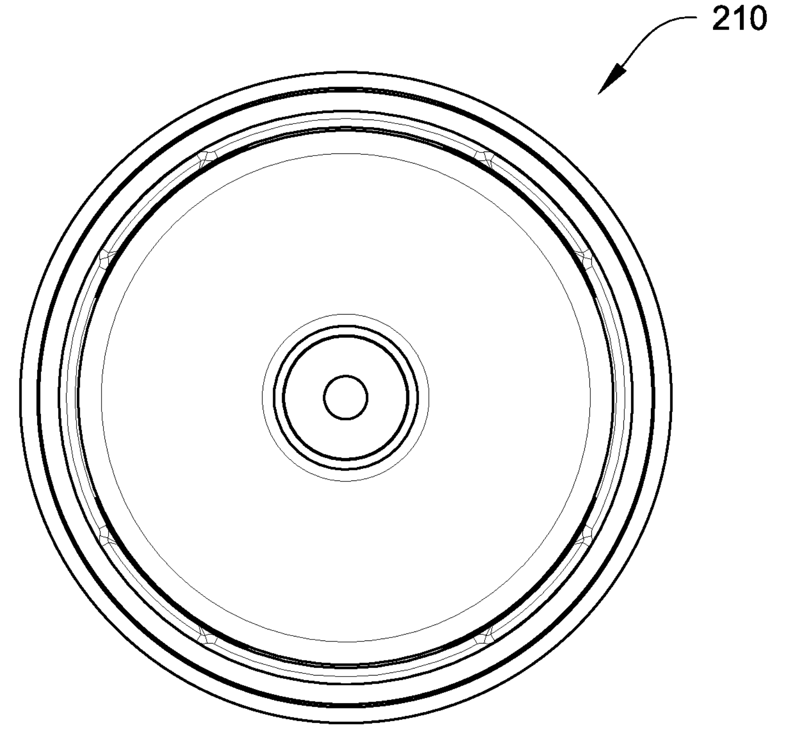

FIGS. 5A-5F illustrate a purge module (or purge cartridge) 210 of a substrate container, according to at least one embodiment. FIG. 5A is a side view of the purge module 210. FIG. 5B is a cross-sectional view of the purge module 210. FIG. 5C is a cross-sectional perspective view of the purge module 210. FIG. 5D is a perspective top view of the purge module 210. FIG. 5E is a perspective bottom view of the purge module 210. FIG. 5F is a bottom view of the purge module 210. It will be appreciated that the purge module 210 can be disposed in a purge port of the substrate container.

Figures 6A, 6B:
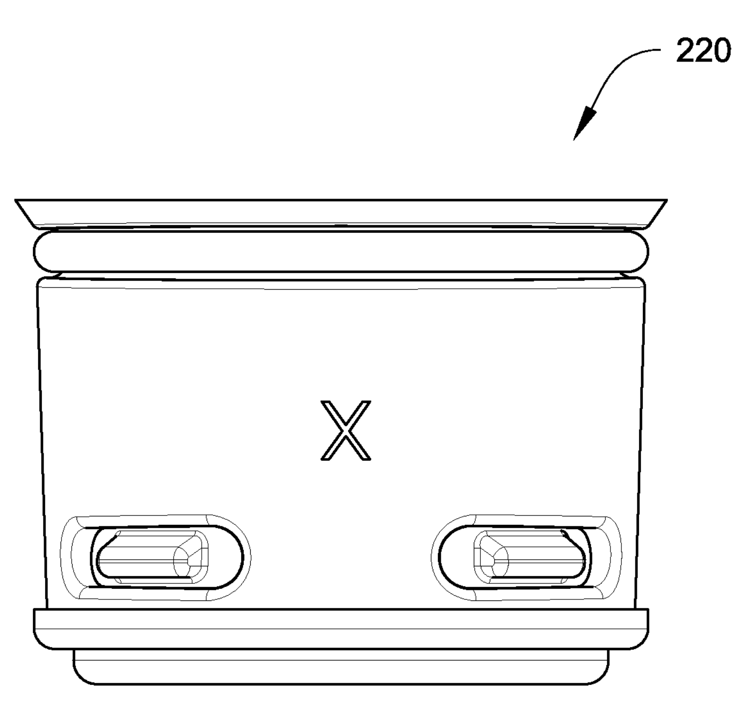
FIGS. 6A-6F illustrate another purge module of a substrate container, according to at least one embodiment.
Figure 6C:
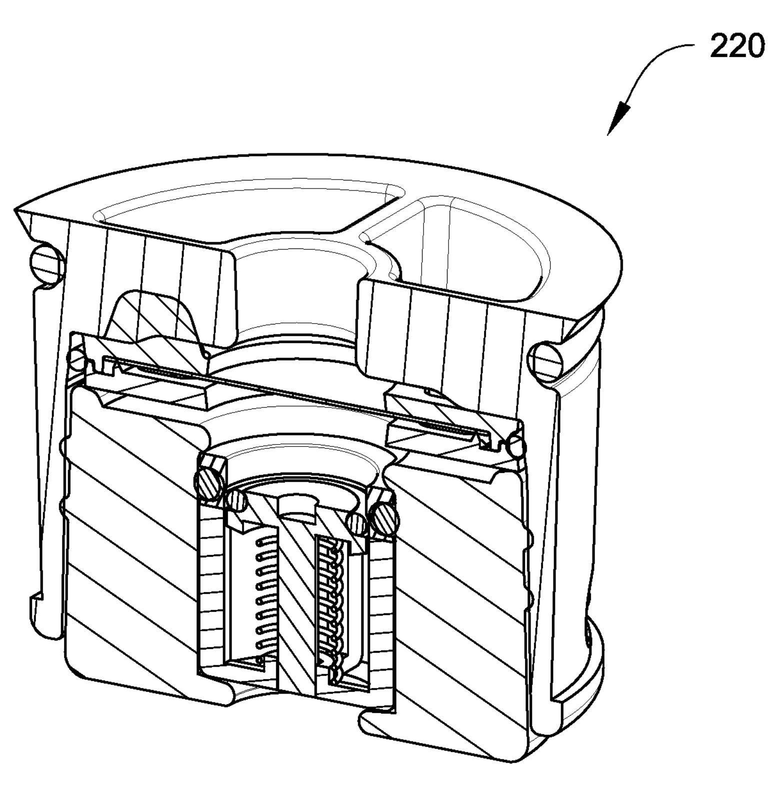
Figure 6D:
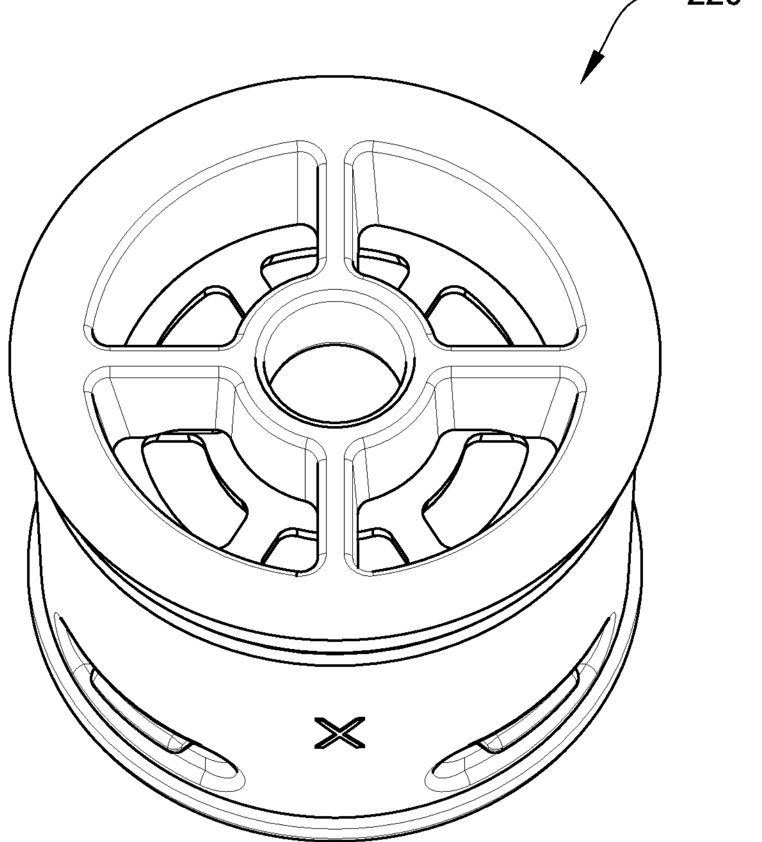
Figure 6E:
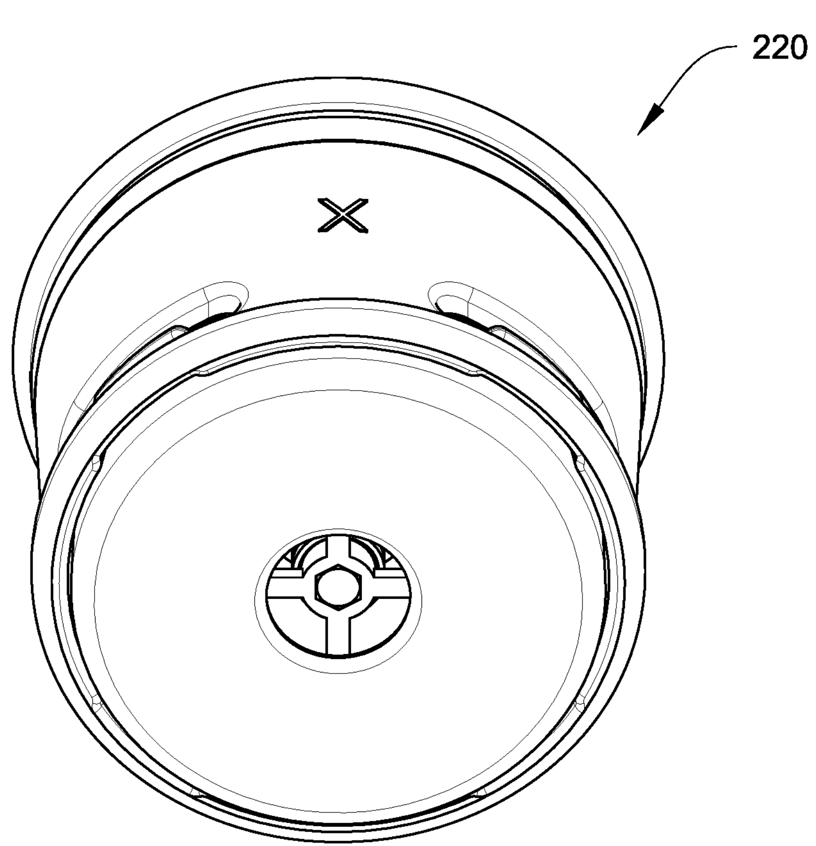
Figure 6F:
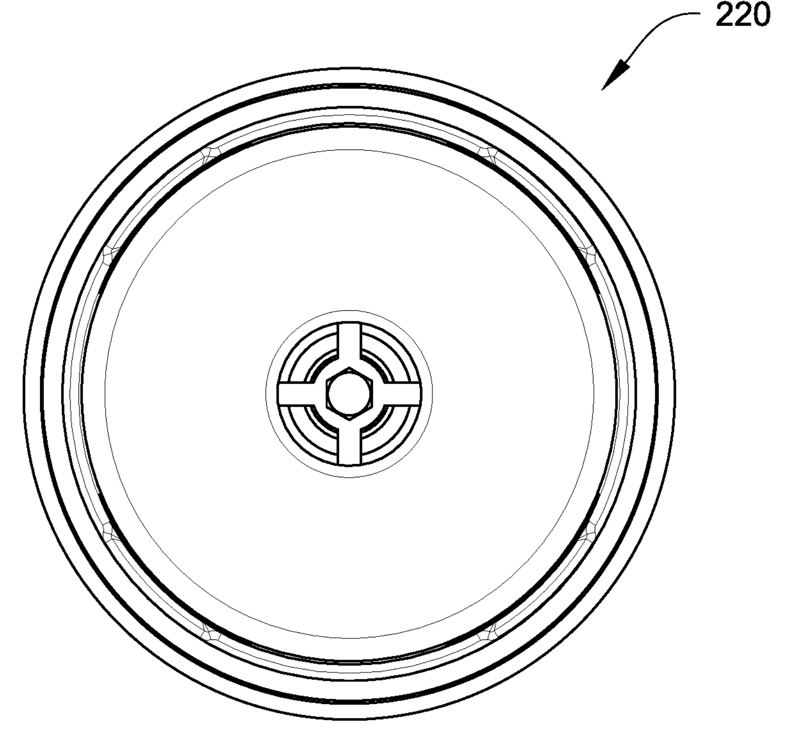

FIGS. 6A-6F illustrate another purge module 220 of a substrate container, according to at least one embodiment. FIG. 6A is a side view of the purge module 220. FIG. 6B is a cross-sectional view of the purge module 220. FIG. 6C is a cross-sectional perspective view of the purge module 220. FIG. 6D is a perspective top view of the purge module 220. FIG. 6E is a perspective bottom view of the purge module 220. FIG. 6F is a bottom view of the purge module 220. It will be appreciated that the purge module 220 can be disposed in a purge port of the substrate container.

It will be appreciated that some embodiments of the purge module are described in U.S. Pat. Nos. 5,810,062, 6,187,182, and 7,328,727, which are incorporated by reference herein in their entirety.

It will be appreciated that in FIGS. 5B, 5F, 6B, 6F, 7A, and 8, the direction along the height of the substrate container is labeled as the "Z" direction. The direction along the length of the substrate container is labeled as the "X" direction. The direction along the width of the substrate container is labeled as the "Y" direction. It will further be appreciated that each purge module can be disposed in a purge port and the purge modules (210, 220) can be disposed in the purge port(s) (e.g., 112A, 112B, 112C, etc.) of FIG. 2.

In FIGS. 5A-5F, the purge module 210 can be configured as a "passive" inlet purge module. That is, a flow control device of the purge module 210 can be opened via a passive mechanism (such as passively opening the flow control device by or via the pressure of the purge fluid flowing into the substrate container). The purge module 210 includes a flow control device (212, 214, 216, 218) configured to control the flow of the purge fluid. In an embodiment, the flow control device can be a check valve, an umbrella valve, a diaphragm, or any other suitable device for controlling the flow of the purge fluid.

In an embodiment as shown in FIG. 5B, the flow control device includes a body 212, a valve member 214 and a seal/seat for the valve member 214, an elastic member (e.g., a spring or the like) 216, and a stem 218. In an embodiment, the valve member 214 and the stem 218 can be referred to as a plunger. The body 212 is the outer casing that contains the internal parts of the flow control device. The valve member 214 is a movable obstruction inside the body 212 that adjustably restricts the flow of the purge fluid through the flow control device. The elastic member 216 is disposed inside the body 212 and is configured to shift the valve member 214 into a position (i.e., a closed position or a sealed position or status of the flow control device) by default (by the elastic force of the elastic member 216 only, without upwards force(s) being exerted on the valve member 214 to compress the elastic member 216) but allow control to reposition the valve member 214. The stem 218 is wrapped by and disposed inside the elastic member 216, and may move along with the valve member 214.

In operation, the purge module 210 can be configured as a passive inlet purge module. The end surface 210A of the purge module 210 faces the interior space of the substrate container. The end surface 210B of the purge module 210 faces the outside of the substrate container and faces the load port. The valve member 214 is disposed at the end surface 210B side. Before starting the purge process, there is no purge fluid flow (and no other forces from active mechanisms), and the flow control device is at a closed position due to e.g., the elastic force of the elastic member 216. When the purge process is started, purge fluid is streamed and flows into the substrate container via the purge module 210. The flow of the purge fluid exerts an upward force on the valve member 214. When the pressure of the purge fluid increases to a level that is greater than the cracking pressure of the flow control device of the purge module 210, the force pushes the valve member 214 to move upwards (along with the stem 218), and compresses the clastic member 216 (to overcome the elastic force of the elastic member 216) so that the flow control device changes from a closed position (at which the purge fluid is prevented from flowing through the flow control device) to an open position (at which the purge fluid may flow through the flow control device), e.g., in a direction from the load port to the interior space of the substrate container.

In FIGS. 6A-6F, the purge module 220 can be configured as a "passive" outlet purge module. That is, a flow control device of the purge module 220 can be opened via a passive mechanism (such as passively opening the flow control device by or via the pressure of the purge fluid inside the substrate container) The purge module 220 includes a flow control device (212, 214, 216, 218) configured to control the flow of the purge fluid. In an embodiment, the flow control device of purge module 220 can be the same as the flow control device of purge module 210, except for the orientation (e.g., whether the valve member 214 is disposed/oriented at the side facing the interior space of the substrate container, or at the side facing the load port).

In operation, the purge module 220 can be configured as an outlet purge module. The end surface 220A of the purge module 220 faces the interior space of the substrate container. The end surface 220B of the purge module 220 faces outside of the substrate container and faces the load port. The valve member 214 is disposed at the end surface 220A side. Before starting the purge process, there is no purge fluid flow (and no other forces from active mechanisms), and the flow control device is at a closed position due to e.g., the elastic force of the elastic member 216. When the purge process is started, purge fluid is streamed and flows into the substrate container via the purge module 210, and the internal pressure of the substrate container increases. The pressure of the purge fluid inside the substrate container causes a downward force exerted on the valve member 214. When the internal pressure of the substrate container increases to a level that is greater than the cracking pressure of the flow control device of the purge module 220, the force pushes the valve member 214 to move downwards (along with the stem 218), and compresses the elastic member 216 (to overcome the elastic force of the elastic member 216) so that the flow control device changes from a closed position (at which the purge fluid is prevented from flowing through the flow control device) to an open position (at which the purge fluid may flow through the flow control device), e.g., in a direction from the interior space of the substrate container to the load port.

Figure 7A:
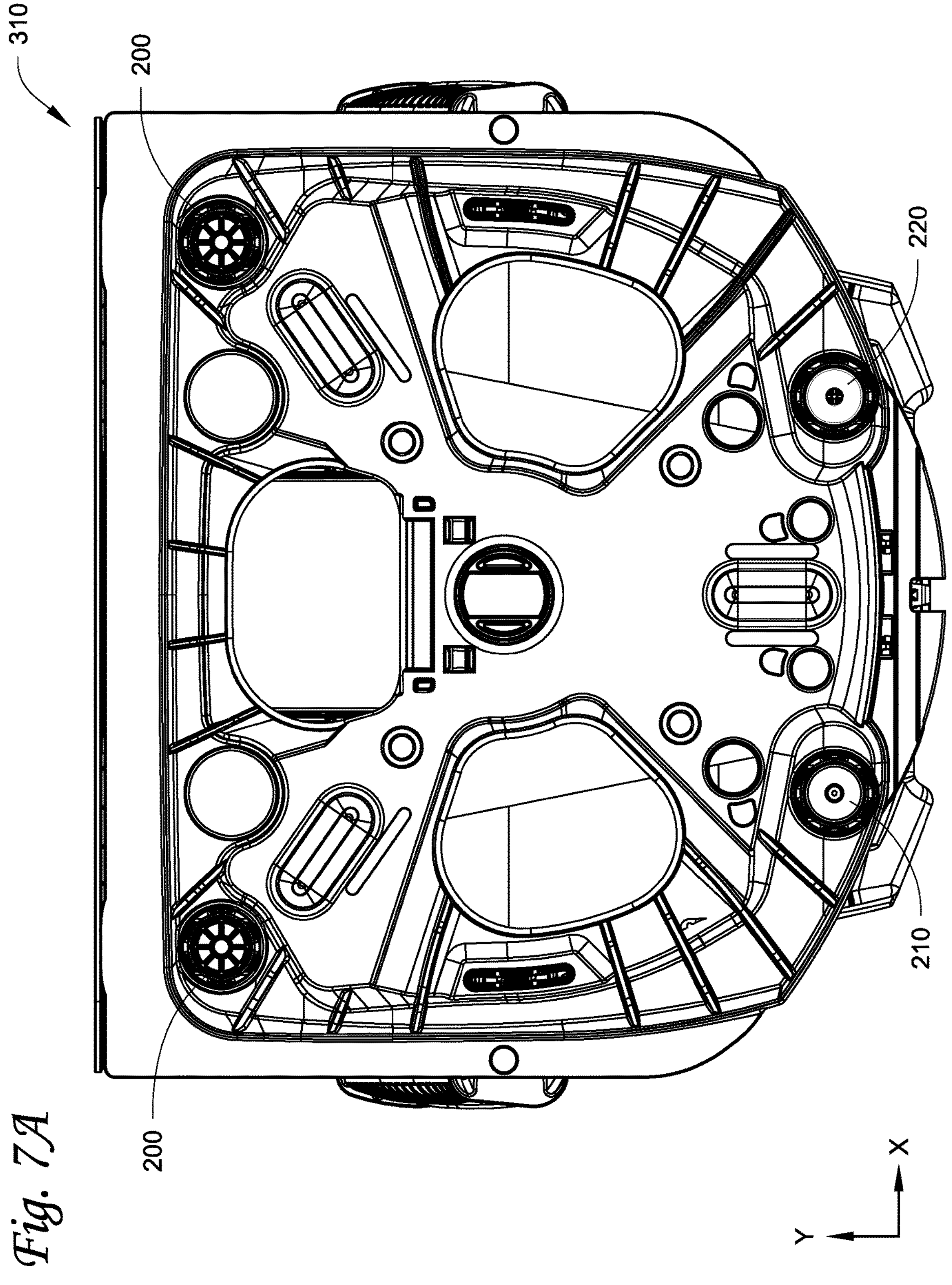
FIGS. 7A-7B illustrate bottom views of a substrate container, according to at least one embodiment.
Figure 7B:
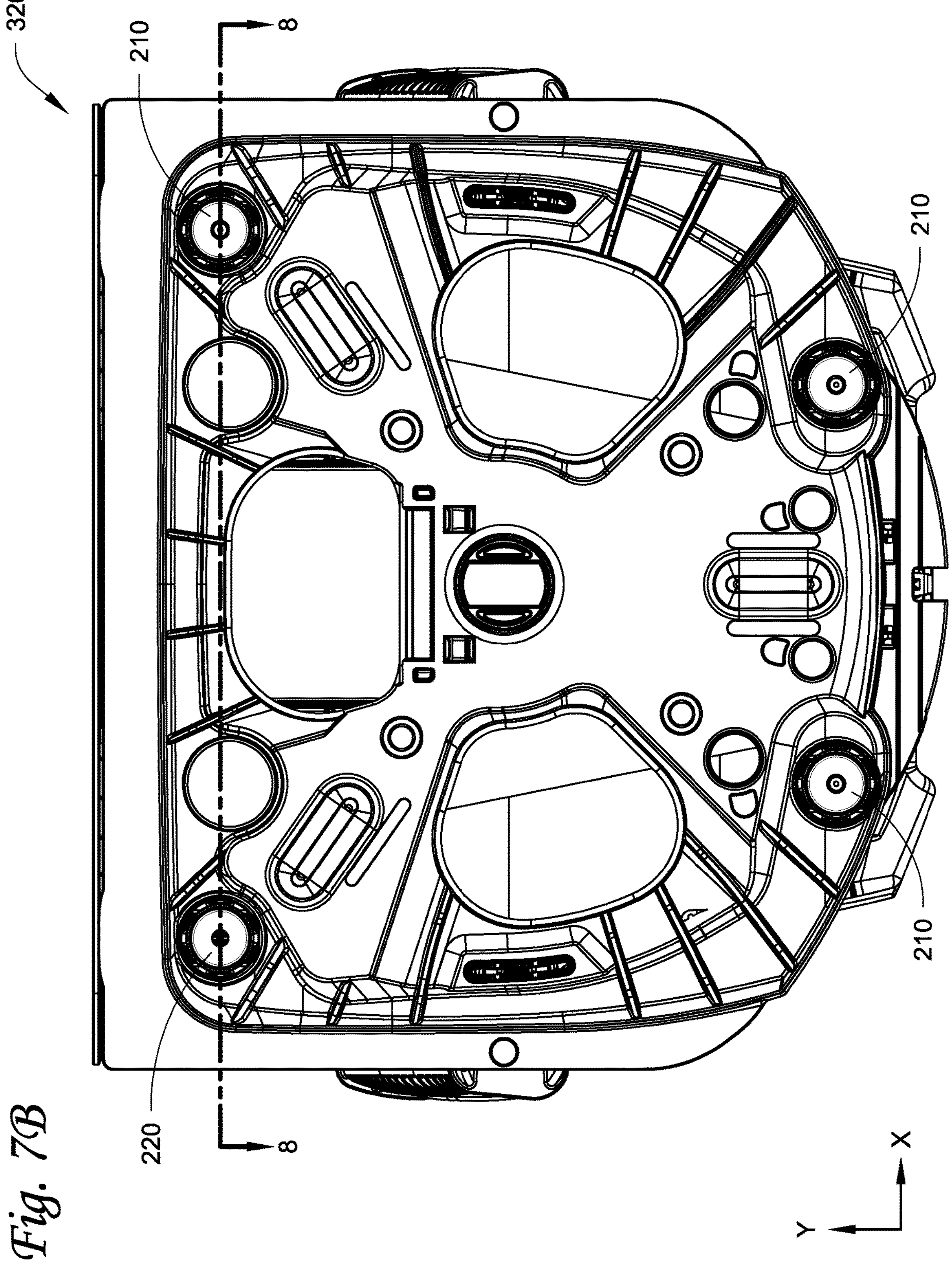

FIGS. 7A-7B illustrate bottom views of a substrate container, according to at least one embodiment. As shown in FIG. 7A, the substrate container 310 includes four purge ports. Two purge ports 200 are plugged. That is, no purge module is disposed/housed in the purge ports 200, and/or the purge ports 200 are plugged with a closed cartridge (or a body, a plug, or the like) and are inoperable for directing the purge fluid. One purge port is configured to house a passive inlet purge module 210. Another purge port is configured to house a passive outlet purge module 220. It will be appreciated that each of the purge modules 200 can be the same as any one of the purge modules (210, 220). It will be appreciated that the substrate container 310 can include any suitable number (e.g., one, two, or the like) of plugged purge ports 200. As shown in FIG. 7B, the substrate container 320 includes four purge ports. Three purge ports are configured to house passive inlet purge modules 210. One purge port is configured to house a passive outlet purge module 220.

Figure 8:
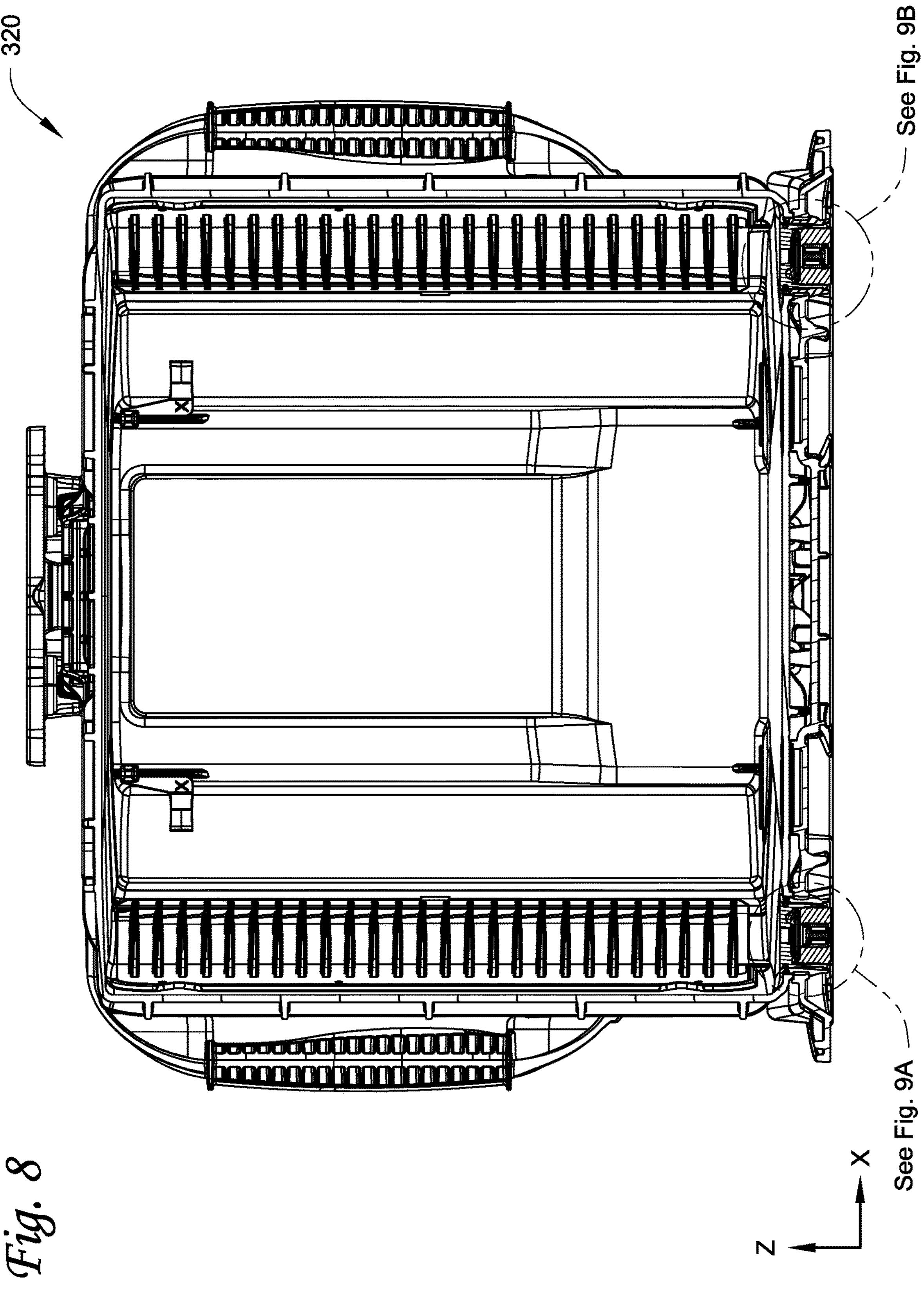
FIG. 8 is a cross-sectional view of the substrate container of FIG. 7B along the dotted line 8-8, according to at least one embodiment.
Figure 9A:
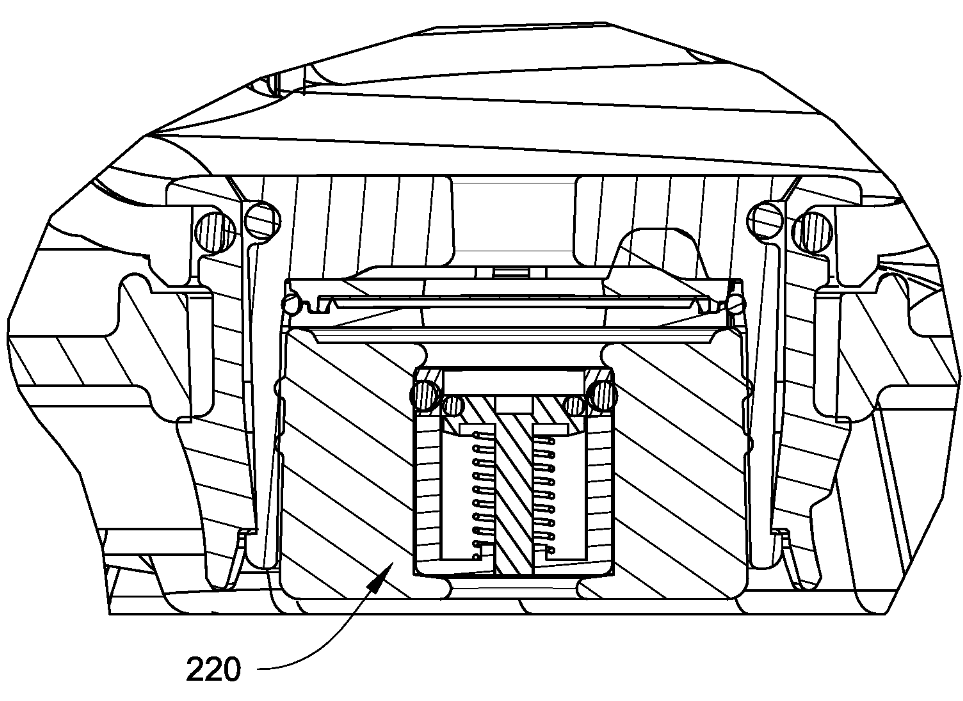
FIG. 9A is an enlarged view of a portion of FIG. 8, according to at least one embodiment.
Figure 9B:
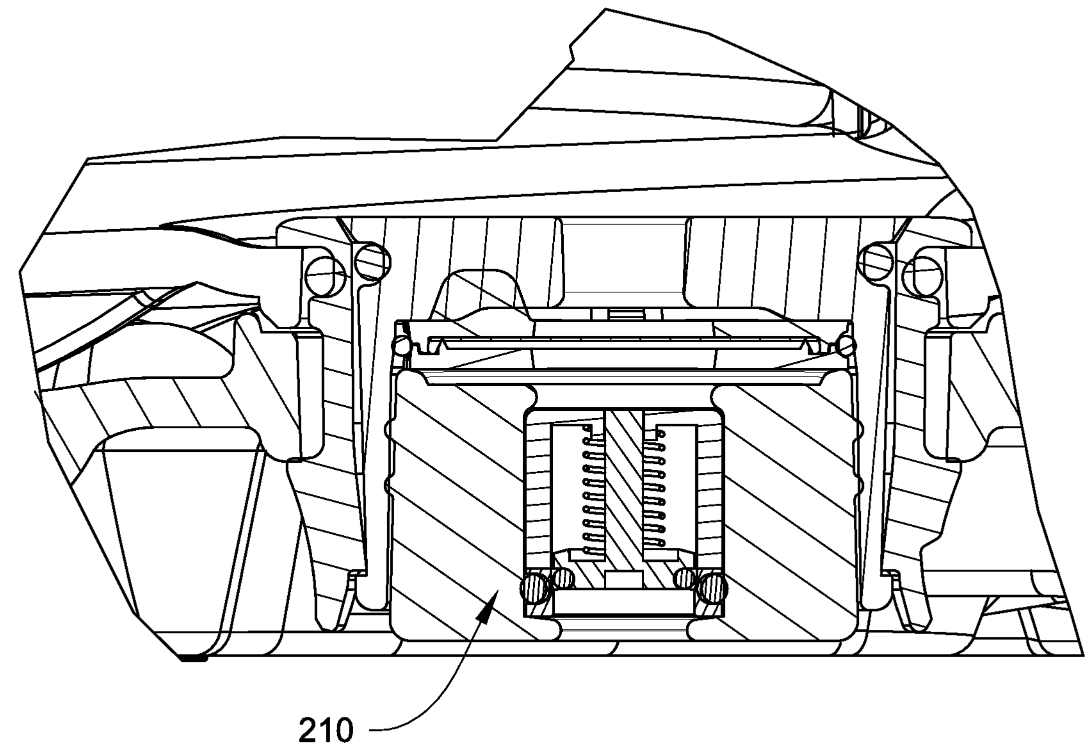
FIG. 9B is an enlarged view of another portion of FIG. 8, according to at least one embodiment.

FIG. 8 is a cross-sectional view of the substrate container 320 of FIG. 7B along the dotted line 8-8, according to at least one embodiment. FIG. 9A is an enlarged view of a portion of FIG. 8, according to at least one embodiment. FIG. 9B is an enlarged view of another portion of FIG. 8, according to at least one embodiment. As shown in FIG. 9A, the enlarged portion includes a purge module 220 configured as a passive outlet purge module. As shown in FIG. 9B, the enlarged portion includes a purge module 210 configured as a passive inlet purge module.

Figure 10:
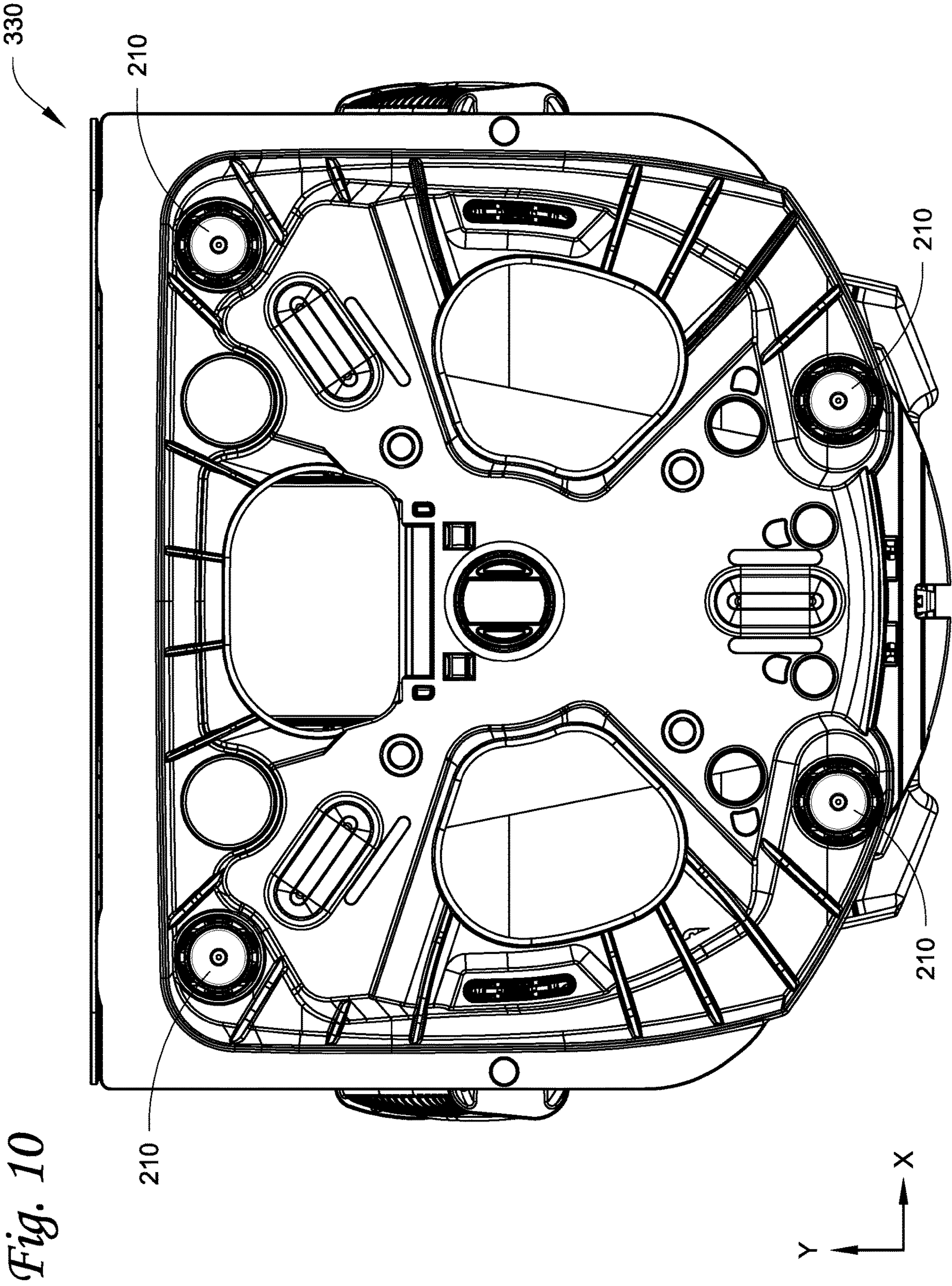
FIG. 10 illustrate a bottom view of a substrate container, according to at least one embodiment.
Figure 11:
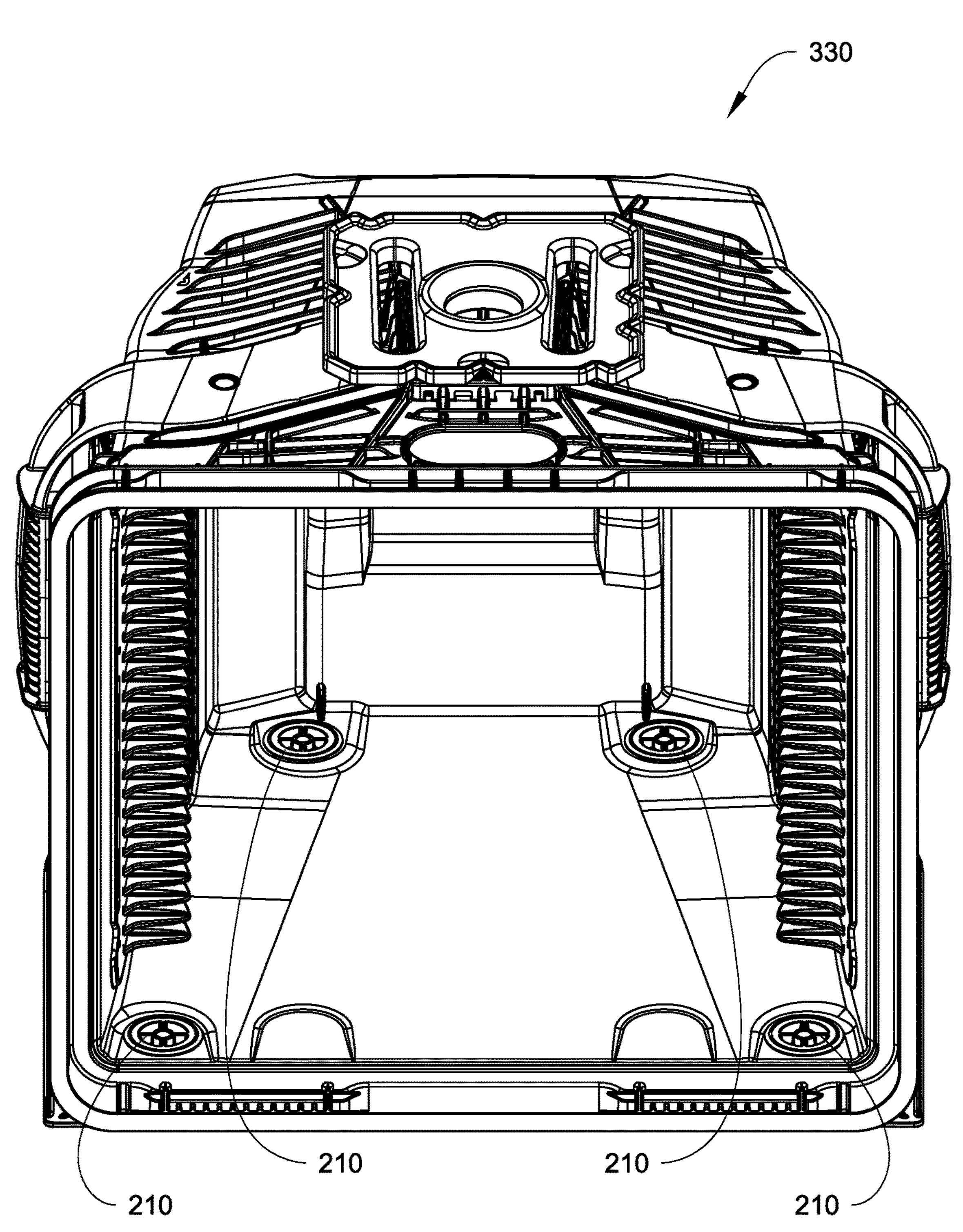
FIG. 11 is a front perspective view of the substrate container of FIG. 10, according to at least one embodiment.

FIG. 10 illustrate a bottom view of a substrate container 330, according to at least one embodiment. FIG. 11 is a front perspective view of the substrate container 330 of FIG. 10 (without showing a door of the substrate container 330), according to at least one embodiment. As shown in FIGS. 10 and 11, the substrate container 330 includes four purge modules, each having a flow control device. It will be appreciated that the substrate container 330 can include at least two purge modules, or any other suitable number of purge modules.

In FIGS. 10 and 11, the flow control devices of all purge modules are configured and/or oriented the same as each other (e.g., such that each purge module is configured as a passive inlet purge module 210). When the purge port(s) is connected to the source of the purge fluid, such configuration and/or orientation can allow passively opening the flow control device(s) by or via the pressure of the purge fluid (e.g., flowing into the interior space of the substrate container) during a purge process of the substrate container. When the purge port(s) is not connected to the source of the purge fluid, such configuration and/or orientation can also prevent passively opening the flow control device(s) by or via the pressure of the purge fluid (e.g., flowing out of the interior space of the substrate container) inside the substrate container during a purge process of the substrate container, since the internal pressure of the substrate container can causes a downward force on the valve member 214 to keep the flow control device closed.

In such an embodiment, opening or a control of opening the flow control device to allow the purge fluid to pass through the flow control device (e.g., for egress of the purge fluid from the interior space of a substrate container) can be performed using an active mechanism (e.g., with an actuator or the like). That is, the flow control device can be actuated (to open for egress of the purge fluid from the interior space of a substrate container) via an actuating mechanism (not shown). It will be appreciated that actuating the flow control device (mechanically or the like) for egress of purge fluid can occur in conjunction with either actuating (mechanically or the like) or passively opening other flow control devices for ingress of purge fluid. In an embodiment, the actuating mechanism includes an actuator (e.g., a solenoid controlling a pin, a mechanical device, or the like) to actuate the flow control device. For example, the actuator can be controlled to touch and push the valve member 214 of the flow control device upwardly, and to exert an upward force on the valve member 214 to overcome the internal pressure of the substrate container (plus the elastic force of the elastic member 216), such that the flow control device can be open and the purge fluid from the interior space of the substrate container can flow out of the substrate container (and the internal pressure of the substrate container reduces). In an embodiment, the actuating mechanism can be on or a part of the substrate container. In another embodiment, the actuating mechanism can be separated from or independent to the substrate container (e.g., the actuating mechanism being disposed on the load port or the like).

In an embodiment, any one of the purge modules of the substrate container 330 can include a particle filter or a vent. In an embodiment, the substrate container 330 can include a pressure relief valve. The pressure relief valve can be configured to open when e.g., an internal pressure of substrate container is at or above a cracking pressure of a door-seal of the substrate container (e.g., during normal use or the like). It will be appreciated that in a situation that the door-seal and the inlet oriented check valve cracking pressures can be dangerously high if the container were to be purged/pressurized without at least one of the inlet oriented check valves actuated during purge. In such case, the pressure relief valve can be configured to open at a pressure level that is less than the system cracking pressure to ensure that the container does not fail under pressure. It will also be appreciated that the cracking pressure of the pressure relief valve may be lower than the cracking pressure of the door-seal. If the system pressure (e.g., the door-seal and the inlet oriented check valve cracking pressures) is dangerously high (e.g., at or above a threshold), then the pressure relief valve can be configured to open e.g., in the case that the purge module(s) designated for egress is inadvertently not actuated. In an embodiment, one or more of the flow control devices of the purge modules of the substrate container 330 can be actuated (or un-actuated) simultaneously or in sequence to achieve a desired purge.

Figures 12A, 12B:
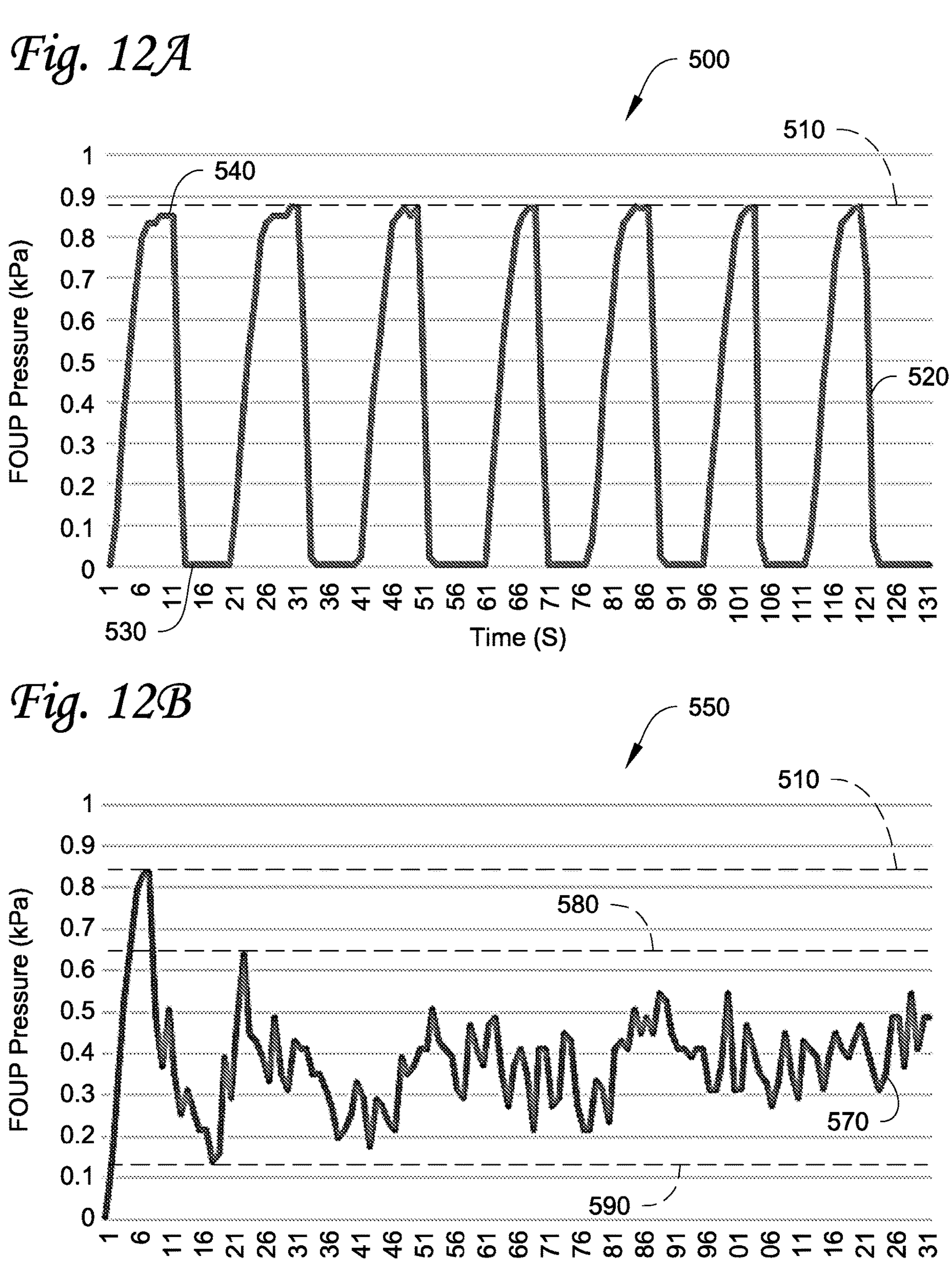
FIG. 12A is a diagram illustrating an internal pressure of a substrate container during a purge process, according to at least one embodiment.
FIG. 12B is another diagram illustrating an internal pressure of a substrate container during a purge process, according to at least one embodiment.

FIG. 12A is a diagram 500 illustrating an internal pressure of a substrate container during a purge process, according to at least one embodiment. FIG. 12B is another diagram 550 illustrating an internal pressure of a substrate container during a purge process, according to at least one embodiment. It will be appreciated that the diagram 500 illustrates seven purging operations that demonstrate an issue with the door cracking due to container pressurization. The point 540 denotes a cracking pressure of the door seal. The diagram 500 illustrates that during a purge process (e.g., a close-door purge), the container is pressurized until it reaches the cracking pressure of the door seal. In such case, instead of continuing, the purge is stopped but it could have continued with the purge fluid leaking out of the door. The operation is repeated seven times to demonstrate reproducibility. The diagram 550 illustrates that the once 510 (same as 540) is reached, the system can react by actuating a flow control device of a purge module in a purge port to relieve pressure to a level below the cracking pressure of the door seal. In such case, the purge fluid can egress in a controlled manner out of the purge port (housing the actuated flow control device) instead of leaking around the door.

As shown in FIGS. 12A and 12B, the vertical coordinate represents the internal pressure (e.g., in the unit of kilopascal or kPa) of a substrate container (e.g., during a purge process). In an embodiment, the substrate container can be a wafer or reticle carrier, e.g. a FOUP, a pod (such as an extreme ultraviolet light (EUV) reticle pod), or the like. The horizontal coordinate represents the time (e.g., in the unit of seconds) of the purge process.

During a purge process (e.g., a close-door purge process or the like), purge fluid is streamed into the interior space of the substrate container via the purge port(s) (e.g., the inlet purge port(s)), and the internal pressure 520 of the substrate container is increasing.

It will be appreciated that purging with a purge fluid such as a dry gas can help to lower the % RH. If an inert gas is used as the purge fluid, then evacuating the inert gas out of the container via actuated purge module(s) instead of leaking the inert gas out the door can be economical and safe. Using the inert gas as the purge fluid can have the added benefit of lowering oxygen. It will also be appreciated that increased internal pressurization of a substrate container can help extending oxygen recovery. Increased internal pressurization can extend the time for the internal pressure to decay to ambient. Regarding the oxygen recovery, it will be appreciated that purging with an inert gas (as the purge fluid) can lower the oxygen level in the container to e.g., at or about zero parts per million (ppm). Oxygen recovery can be referred to as a process that the oxygen level raises to certain prescribed level, e.g. 200 ppm, 10,000 ppm, or 21%, or the like. The lower the oxygen level in the container, the less oxidation may occur of the circuitry during semiconductor production. As such, typically a high (e.g., at or about one kPa to at or about five kPa) cracking pressure exhaust check valve (of the outlet purge port(s)) may be needed to allow the substrate container to pressurize to a desired level. In contrast, a low (e.g., less than one kPa) cracking pressure exhaust check valve may also be desirable when purging a substrate container to ensure that the purge fluid passively exits through the exhaust port (the outlet purge port) due to the internal pressure of the substrate container opening the exhaust check valve. Also the internal pressure of the substrate container exceeding the door seal cracking pressure (of the substrate container) may generate a leak from the door seal. Therefore, typically the passive "outlet" check valve (e.g., of the purge module 220 of FIG. 5B) need to have a lower cracking pressure than the door seal cracking pressure. It will be appreciated that a sectional area of the door seal is typically much larger than that of a purge port. Even if a passive cracking pressure of the purge port is lower than that of the door seal, most of the purge fluid nevertheless may flow around the door. If one were to "solve" this conundrum by lowering the purge port cracking pressure to zero or near zero, then the oxygen in the container may quickly raise.

In typical substrate container configurations, the substrate container can include three inlet purge ports and one outlet purge port, or two inlet purge ports and two outlet purge ports, or the like (see FIGS. 7A and 7B). With such configurations, during the purge process, purge fluid flows into the substrate container through the inlet purge ports and exhausts passively through the outlet purge port(s). The internal pressure inside of the substrate container opens the check valve of the outlet purge module(s) at a known cracking pressure (aka. valve minimum opening pressure, e.g., less than four kPa). Typically, due to the low (e.g., at or about or greater than five kPa) cracking pressure of the door seal, the cracking pressure of the check valve of the outlet purge module(s) need to be correspondingly low in value to ensure that the purge fluid exhausts through the outlet purge port(s) before exhausting through the door seal.

Embodiments disclosed herein (e.g., as described in FIGS. 10 and 11) can provide a substrate container having all of the flow control devices of all of the purge modules configured and/or oriented the same as each other (such that each purge module is configured as a passive inlet purge module 210). When the purge port(s) is connected to the source of the purge fluid, such configuration and/or orientation can allow passively opening the flow control device(s) by or via the pressure of the purge fluid (e.g., flowing into the interior space of the substrate container) during a purge process of the substrate container. When the purge port(s) is not connected to the source of the purge fluid, such configuration and/or orientation can also prevent passively opening the flow control device(s) by or via the pressure of the purge fluid (e.g., flowing out of the interior space of the substrate container) inside the substrate container during a purge process, since the internal pressure of the substrate container applies a downward force on the valve member 214 to keep the flow control device closed. In such an embodiment, opening or a control of opening the flow control device to allow the purge fluid to pass through the flow control device (e.g., for egress of the purge fluid from the interior space of a substrate container) can be performed using an active mechanism (e.g., with an actuator or the like).

Returning to FIG. 12A, with the purge port configuration of FIGS. 10 and 11, any one of the flow control devices can be configured to have a cracking pressure greater than a cracking pressure of the door-seal of the substrate container, and/or greater than a cracking pressure of a typical flow control device (e.g., 220 of FIGS. 6A-6F). During the purge process (e.g., a close-door purge process or the like), purge fluid is streamed into the interior space of the substrate container via the purge port(s) that is connected to the source of the purge fluid, and without actuating the flow control device(s) of the purge module(s), the internal pressure 520 can be increased until the door seal cracking pressure 510 is reached at point 540. At point 540, purge fluid may leak out through the door gasket during the purge process if no action is taken (e.g., no flow control device of the purge module is actuated). At point 540, one or more the flow control devices of the purge module(s) can be actuated (to open for egress of the purge fluid from the interior space of the substrate container) via an actuating mechanism. That is, each purge module with an actuated flow control device can function as an "outlet" purge module, such that the purge fluid can be discharged from the interior space of the substrate container via the actuated flow control device of each "outlet" purge module, and the internal pressure 520 can reach zero at point 530 (without the purge fluid leaking through the door seal). At point 530, the actuated flow control device can be unactuated (i.e., without being actuated by the actuating mechanism), and the internal pressure of the substrate container and/or the elastic force of the elastic member of the flow control device can keep the flow control device closed to prevent egress of the purge fluid from the interior space of the substrate container. The internal pressure 520 may increase again when the purge fluid continues to be streamed into the substrate container.

As shown in FIG. 12B, with the purge port configuration of FIGS. 10 and 11, during the purge process (e.g., a close-door purge process or the like), the internal pressure 570 can be maintained below the door cracking pressure 510 (e.g., between a first threshold 580 and a second threshold 590), by actuating and un-actuating one or more the flow control devices of the purge module(s). For example, when purge fluid is streamed into the interior space of the substrate container via the purge port(s) that is connected to the source of the purge fluid, and without actuating the flow control device(s) of the purge module(s), the internal pressure increases such that the first threshold 580 (which may be equal to or less than the door cracking pressure 510) is reached, one or more the flow control devices of the purge module(s) can be actuated (to open for egress of the purge fluid from the interior space of the substrate container) via an actuating mechanism, so that the internal pressure 570 decreases until the second threshold 590 is reached. When the second threshold 590 is reached, the one or more the flow control devices of the purge module(s) can be unactuated (to close to prevent egress of the purge fluid from the interior space of the substrate container) so that the internal pressure 570 increase (since the purge fluid continues to be streamed into the substrate container during the purge process). It will be appreciated that in another embodiment, the door cracking pressure 510 is known so that the system can actuate the one or more the flow control devices when the first threshold 580 is reached (before the door cracking pressure 510 is reached). It will also be appreciated that in an embodiment, the internal pressure 570 does not need to reach the threshold 580 or 590. In such embodiment, the internal pressure 570 can be kept within a percentage of the limits of the threshold 580 or 590, by e.g., actuating or unactuating the one or more the flow control devices of the purge module(s). It will further be appreciated that in an embodiment, the controller can be configured to actuate the one or more the flow control devices of the purge module(s) continuously to control the egress flow rate of the purge fluid.

Figure 13:
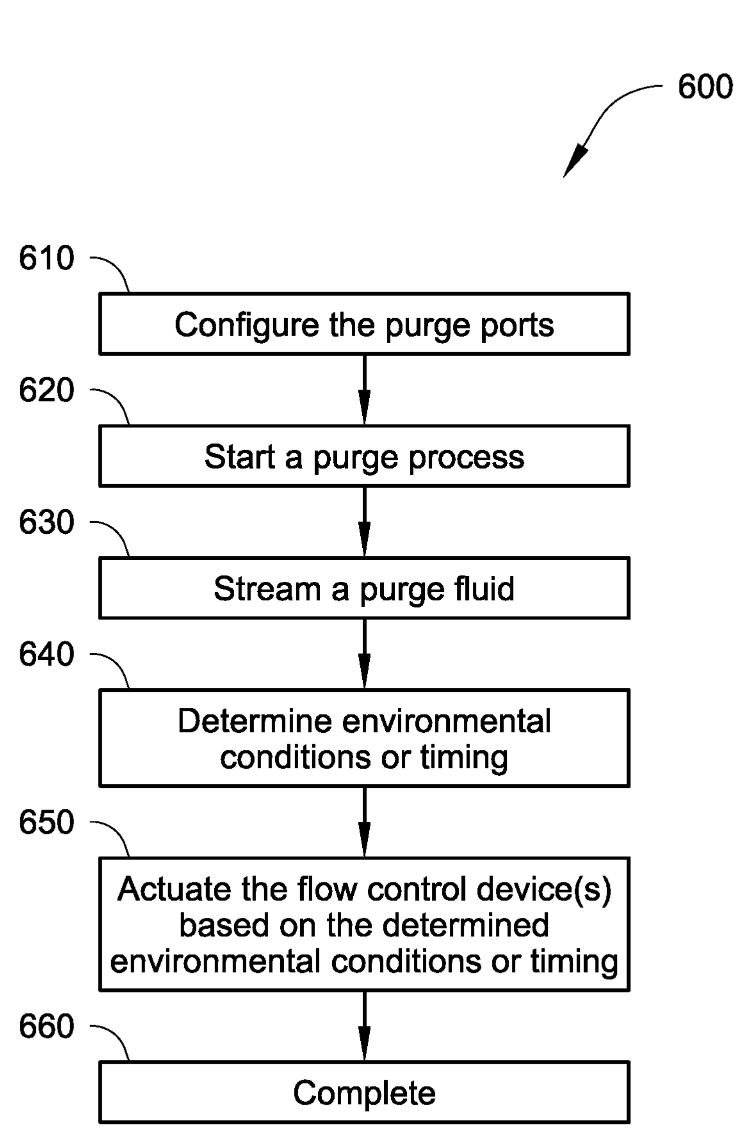
FIG. 13 shows an operational flow chart for actuating one or more flow control devices of purge module(s) of a substrate container, according to at least one example embodiment.

FIG. 13 shows an operational flow chart 600 for actuating one or more flow control devices of purge module(s) of a substrate container, according to at least one example embodiment.

The operational flow 600 may include one or more operations, actions, or functions depicted by one or more blocks 610, 620, 630, 640, 650, and 660. Although illustrated as discrete blocks, various blocks may be divided into additional blocks, combined into fewer blocks, or eliminated, depending on the desired implementation. As a non-limiting example, the description of the method 600, corresponding to the purge port configuration thereof in FIGS. 10 and 11 and performed by a controller, according to one or more example embodiments described herein, pertains to actuating one or more flow control devices of purge module (s) of a substrate container for a purge process.

It will be appreciated that in an embodiment, the controller can include a processor, a memory, an input/output, and/or a storage. It is to be appreciated that the controller can include one or more additional components. The processor can retrieve and execute programming instructions stored in the memory and/or the storage. The processor can also store and retrieve application data residing in the memory. The processor can be a single processor, multiple processors, co-processors, or a single processor having multiple processing cores. In some embodiments, the processor can be a single-threaded processor. In some embodiments, the processor can be a multi-threaded processor. The memory is generally included to be representative of a random access memory such as, but not limited to, Static Random Access Memory (SRAM), Dynamic Random Access Memory (DRAM), Flash, suitable combinations thereof, or the like. In some embodiments, the memory can be a volatile memory. In some embodiments, the memory can be a non-volatile memory. The input/output can include both wired and wireless connections.

The processing flow 600 may begin at block 610. Block 610 may refer to preparing the substrate container including configuring and/or orienting all of the flow control devices of all of the purge modules of the substrate container the same as each other (see descriptions for FIGS. 10 and 11). With such configuration or orientation, all of the purge modules can be configured as "passive" inlet purge modules (i.e., allowing passively opening the flow control device by or via the pressure of the purge fluid flowing into the substrate container). Block 610 may be followed by block 620.

Block 620 may refer to the controller controls starting or initiating a purge process (e.g., a close door purge process or the like). Block 620 may be followed by block 630.

Block 630 may refer to the controller controls streaming a purge fluid into an interior of a substrate container via one of more of the purge ports of the substrate container by e.g., connecting/opening the purge port(s) to the source of the purge fluid. Since all of the purge modules are configured as "passive" inlet purge modules, the purge fluid can be streamed into the substrate container via any one or more of the purge ports simultaneously or in sequence, based on e.g., required/desired/predetermined purge fluid flow rate or flow volume. Block 630 may be followed by block 640.

Block 640 may refer to one or more sensors detecting/sensing/measuring one or more environmental conditions on or in the interior of the substrate container in real-time or during a period of time. The one or more environmental conditions may include one or more of relative humidity (%

RH), internal pressure (e.g., absolute pressure), oxygen levels, temperature, a measured presence of airborne molecular contaminant, a measured presence of one or more volatile organic compounds (VOCs), etc. The one or more sensors can be disposed or mounted on the substrate container or in the interior space of the substrate container. It will be appreciated that the one or more sensors can be located external to the container within the system that supplies the purge. The one or more environmental conditions may be communicated from the one or more sensors to the controller. In another embodiment, Block 640 may refer to the controller determining a timing. Block 640 may be followed by block 650.

Block 650 may refer to the controller controls actuating (e.g., via controlling an actuating mechanism) or un-actuating one or more flow control devices of the purge module(s) of the substrate container, based on the determined environmental condition(s) or the determined timing.

For example, during the purge process, the purge fluid is streamed into the substrate container, and the internal pressure of the substrate container is increasing. The controller can be configured to actuate one or more flow control devices (e.g., for egress or discharge of the purge fluid from the interior space of the substrate container) or un-actuate the one or more flow control devices (e.g., to close the one or more flow control devices to prevent egress of the purge fluid from the interior space of the substrate container) based on a sensed internal pressure of the substrate container (e.g., to maintain an internal pressure of the substrate container below a cracking pressure of a door-seal of the substrate container or the like). See descriptions for FIGS. 12A and 12B.

In another example, during the purge process, the purge fluid is streamed into the substrate container, and the controller can be configured to actuate one or more flow control devices (e.g., for egress of the purge fluid from the interior space of the substrate container) or un-actuate the one or more flow control devices (e.g., to close the one or more flow control devices to prevent egress of the purge fluid from the interior space of the substrate container) based on timing (e.g., based on an amount of time or timed to an event, which can be customer or application specific timing).

In yet another example, during the purge process, the purge fluid is streamed into the substrate container, and the controller can be configured to actuate one or more flow control devices (e.g., for egress of the purge fluid from the interior space of the substrate container) or un-actuate the one or more flow control devices (e.g., to close the one or more flow control devices to prevent egress of the purge fluid from the interior space of the substrate container) based on sensed environmental condition(s) such as a sensed internal relative humidity of the substrate container, a sensed internal oxygen level of the substrate container, and/or a sensed presence of one or more volatile organic compounds (VOCs) inside the substrate container.

Similar to the discussions for FIGS. 12A and 12B, when the sensed environmental condition(s) is e.g., above a desired range (or above a maximum allowed threshold), the controller can be configured to actuate one or more flow control devices (e.g., for egress of the purge fluid from the interior space of the substrate container) to e.g., reduce a level of the environmental condition(s). When the sensed environmental condition(s) is e.g., below a desired range (or below a minimum allowed threshold), the controller can be configured to un-actuate one or more flow control devices (e.g., to close the one or more flow control devices to prevent egress of the purge fluid from the interior space of the substrate container) to e.g., increase a level of the environmental condition(s). In an embodiment, a desired range of the environmental condition(s) can be from 0% to ambient condition. In an embodiment, the control is to reduce or prevent the contaminant (e.g., the VOCs or the like) from entering the substrate container.

In yet another example, during the purge process, the purge fluid is streamed into the substrate container, and the controller can be configured to selectively actuate, unactuate, and/or connect/open the source of purge fluid to, any suitable combination of the flow control devices of the purge modules (e.g., any one or more of the four purge modules) simultaneously or in sequence to maintain a desired purge (e.g., a uniformed distribution or the like) of the purge fluid flow inside the substrate container.

Block 650 may be followed by block 660. Block 660 may refer to the controller controls un-actuating one or more flow control devices of the purge module(s) of the substrate container, when the desired environmental condition(s) is met, when the prescribed time ends, or when the prescribed event occurs/ends, or the like.

Embodiments disclosed herein can help to reduce or eliminate the need to rely on a passive outlet check valve to passively open due to internal pressure during a purge process, can provide higher internal pressurization of the substrate container during e.g., a closed door purge process leading to improved oxygen control, can provide improved scaling conductance due to the internal pressure of the container forcing the check valve plunger closed during the purge process, can actuate (e.g., mechanically or the like) the flow control devices of the purge module(s) open or un-actuate the flow control devices of the purge module(s) (so that the flow control devices are closed since no purge modules are passively opened due to the internal pressure of the container) during the purge process as a function of time or matching an environmental condition criteria such as VOCs, % RH, pressure inside of the substrate container, or the like.

Embodiments disclosed herein can use automation to actuate (e.g., mechanically or the like) the purge modules opened or un-actuate the flow control devices of the purge module(s), and can monitor the environmental condition(s) in the substrate container via sensors and actuate (e.g., mechanically or the like) the exhaust to control the level of internal pressure, VOCs, % RH, AMH, oxygen or the like in the substrate container. Embodiments disclosed herein can use automation to selectively actuate and/or to selectively un-actuate a combination of flow control devices of purge modules to assist in efficient evacuation of substrate container to maintain desired environmental condition(s).

ASPECTS

It is appreciated that any one of aspects 1-19 may be combined with any one of aspects 20-27.

Aspect 1. A system, comprising:

a substrate container having at least two purge modules, wherein each purge module of the at least two purge modules includes a flow control device, the flow control device of each purge module is configured to be actuated for egress of a purge fluid.

Aspect 2. The system according to aspect 1, wherein the substrate container is a front opening unified pod (FOUP).

Aspect 3. The system according to aspect 1 or aspect 2, further comprising:

a controller configured to actuate the flow control device.

Aspect 4. The system according to aspect 3, wherein the controller is configured to actuate the flow control device during a close-door purge process.

Aspect 5. The system according to aspect 3 or aspect 4, further comprising:

at least one sensor, wherein the at least one sensor is configured to sense at least one parameter, and the controller is configured to actuate the flow control device based on the sensed at least one parameter.

Aspect 6. The system according to aspect 5, wherein the at least one sensor is a pressure sensor configured to sense an internal pressure of the substrate container.

Aspect 7. The system according to any one of aspects 3-6, wherein the flow control device is actuated via an actuating mechanism, the actuating mechanism is controlled by the controller.

Aspect 8. The system according to aspect 7, wherein the actuating mechanism includes a solenoid controlling an actuator to actuate the flow control device.

Aspect 9. The system according to any one of aspects 1-8, wherein the flow control device is a check valve, the check valve is oriented so that the check valve is opened by pressure or force from outside of the substrate container.

Aspect 10. The system according to any one of aspects 1-9, wherein a cracking pressure of the flow control device is greater than a cracking pressure of a door-seal of the substrate container.

Aspect 11. The system according to any one of aspects 1-10, wherein the at least two purge modules include four purge modules, the system further includes a controller, the controller is configured to selectively actuate a combination of flow control devices of the four purge modules to maintain a desired purge of the purge fluid flow inside the substrate container.

Aspect 12. The system according to any one of aspects 1-11, wherein the system further includes a controller, during a close-door purge process, the controller is configured to actuate the flow control device based on a sensed internal pressure of the substrate container.

Aspect 13. The system according to aspect 12, wherein during the close-door purge process, the controller is configured to maintain an internal pressure of the substrate container below a cracking pressure of a door-seal of the substrate container.

Aspect 14. The system according to any one of aspects 1-13, wherein the system further includes a controller, during a close-door purge process, the controller is configured to actuate the flow control device based on timing.

Aspect 15. The system according to any one of aspects 1-14, wherein the system further includes a controller, during a close-door purge process, the controller is configured to actuate the flow control device based on a sensed internal relative humidity of the substrate container.

Aspect 16. The system according to any one of aspects 1-15, wherein the system further includes a controller, during a close-door purge process, the controller is configured to actuate the flow control device based on a sensed internal oxygen level of the substrate container.

Aspect 17. The system according to any one of aspects 1-16, wherein the system further includes a controller, during a close-door purge process, the controller is configured to actuate the flow control device based on a sensed presence of one or more volatile organic compounds inside the substrate container.

Aspect 18. The system according to any one of aspects 1-17, wherein each purge module of the at least two purge modules includes a particle filter or a vent.

Aspect 19. The system according to any one of aspects 1-18, further comprising:

a pressure relief valve, wherein the pressure relief valve is configured to open when a system pressure is at or above a threshold.

Aspect 20. A method of actuating flow control devices of purge modules of a substrate container, comprising:

starting a purge process of the substrate container;

streaming a purge fluid into an interior of the substrate container, the substrate container having at least two purge modules, each purge module of the at least two purge modules including a flow control device, the flow control device of each purge module being configured to be actuated for egress of the purge fluid; and actuating the flow control device for egress of the purge fluid.

Aspect 21. The method according to aspect 20, further comprising:

sensing at least one parameter via at least one sensor; and actuating the flow control device based on the sensed at least one parameter.

Aspect 22. The method according to aspect 20 or aspect 21, further comprising:

sensing an internal pressure of the substrate container;

actuating the flow control device based on the sensed internal pressure.

Aspect 23. The method according to aspect 22, further comprising:

maintaining the internal pressure of the substrate container below a cracking pressure of a door-seal of the substrate container.

Aspect 24. The method according to any one of aspects 20-23, wherein the at least two purge modules include four purge modules, the method further comprising:

selectively actuating a combination of flow control devices of the four purge modules to maintain a desired purge of the purge fluid inside the substrate container.

Aspect 25. The method according to any one of aspects 20-24, further comprising:

sensing an internal oxygen level of the substrate container;

actuating the flow control device based on the sensed internal oxygen level.

Aspect 26. The method according to any one of aspects 20-25, further comprising:

sensing an internal relative humidity of the substrate container;

actuating the flow control device based on the sensed internal relative humidity.

Aspect 27. The method according to any one of aspects 20-26, further comprising:

actuating the flow control device based on timing.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The terminology used in this specification is intended to describe particular embodiments and is not intended to be limiting. The terms “a.” “an,” and “the” include the plural forms as well, unless clearly indicated otherwise. The terms “comprises” and/or “comprising.” when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. A system, comprising:

a substrate container having at least two purge modules, wherein each purge module of the at least two purge modules includes a flow control device, the flow control device of each purge module is configured to be actuated for egress of a purge fluid, wherein the flow control device is a check valve, the check valve is oriented so that the check valve is opened by pressure or force from outside of the substrate container.

2. The system according to claim 1, wherein the substrate container is a front opening unified pod (FOUP).

3. The system according to claim 1, further comprising:

a controller configured to actuate the flow control device.

4. The system according to claim 3, wherein the controller is configured to actuate the flow control device during a close-door purge process.

5. The system according to claim 3, further comprising:

at least one sensor, wherein the at least one sensor is configured to sense at least one parameter, and the controller is configured to actuate the flow control device based on the sensed at least one parameter.

6. The system according to claim 5, wherein the at least one sensor is a pressure sensor configured to sense an internal pressure of the substrate container.

7. The system according to claim 3, wherein the flow control device is actuated via an actuating mechanism, the actuating mechanism is controlled by the controller.

8. The system according to claim 7, wherein the actuating mechanism includes a solenoid controlling an actuator to actuate the flow control device.

9. The system according to claim 1, wherein a cracking pressure of the flow control device is greater than a cracking pressure of a door-seal of the substrate container.

10. The system according to claim 1, wherein the at least two purge modules include four purge modules, the system further includes a controller, the controller is configured to selectively actuate a combination of flow control devices of the four purge modules to maintain a desired purge of the purge fluid flow inside the substrate container.

11. The system according to claim 1, wherein the system further includes a controller, during a close-door purge process, the controller is configured to actuate the flow control device based on a sensed internal pressure of the substrate container.

12. The system according to claim 11, wherein during the close-door purge process, the controller is configured to maintain an internal pressure of the substrate container below a cracking pressure of a door-seal of the substrate container.

13. The system according to claim 1, wherein the system further includes a controller, during a close-door purge process, the controller is configured to actuate the flow control device based on timing.

14. The system according to claim 1, wherein the system further includes a controller, during a close-door purge process, the controller is configured to actuate the flow control device based on a sensed internal relative humidity of the substrate container.

15. The system according to claim 1, wherein the system further includes a controller, during a close-door purge process, the controller is configured to actuate the flow control device based on a sensed internal oxygen level of the substrate container.

16. The system according to claim 1, wherein the system further includes a controller, during a close-door purge process, the controller is configured to actuate the flow control device based on a sensed presence of one or more volatile organic compounds inside the substrate container.

17. The system according to claim 1, wherein each purge module of the at least two purge modules includes a particle filter or a vent.

18. The system according to claim 1, further comprising:

a pressure relief valve, wherein the pressure relief valve is configured to open when a system pressure is at or above a threshold.

19. A method of actuating flow control devices of purge modules of a substrate container, comprising:

starting a purge process of the substrate container;

streaming a purge fluid into an interior of the substrate container, the substrate container having at least two purge modules, each purge module of the at least two purge modules including a flow control device, the flow control device of each purge module being configured to be actuated for egress of the purge fluid and wherein the flow control device is a check valve, the check valve is oriented so that the check valve is opened by pressure or force from outside of the substrate container; and actuating the flow control device for egress of the purge fluid.

* * * * *